(12) United States Patent
Irving et al.

(10) Patent No.: US 8,221,964 B2
(45) Date of Patent: *Jul. 17, 2012

(54) INTEGRATED COLOR MASK

(75) Inventors: Lyn M. Irving, Rochester, NY (US);
David H. Levy, Rochester, NY (US);
Mark E. Irving, Rochester, NY (US);
Carolyn R. Ellinger, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 1218 days.

This patent is subject to a terminal disclaimer.

(21) Appl. No.: 11/986,068

(22) Filed: Nov. 20, 2007

(65) Prior Publication Data

US 2009/0130610 A1    May 21, 2009

(51) Int. Cl.
*G03F 7/038*    (2006.01)
*G03F 1/58*    (2012.01)

(52) U.S. Cl. ........................................ 430/325

(58) Field of Classification Search .................. None
See application file for complete search history.

(56) References Cited

U.S. PATENT DOCUMENTS

| | | |
|---|---|---|
| 2,371,746 A | 3/1945 | Evans et al. |
| 5,391,507 A | 2/1995 | Kwasnick et al. |
| 5,650,867 A | 7/1997 | Kojima et al. |
| 6,294,445 B1 | 9/2001 | Bol et al. |
| 6,338,988 B1 | 1/2002 | Andry et al. |
| 7,056,834 B2 | 6/2006 | Mei et al. |
| 7,100,510 B2 | 9/2006 | Brost et al. |
| 2002/0017645 A1 | 2/2002 | Yamazaki et al. |
| 2004/0229411 A1 | 11/2004 | Battersby |
| 2007/0269750 A1* | 11/2007 | Irving et al. ................ 430/322 |
| 2009/0130600 A1* | 5/2009 | Irving et al. ................ 430/312 |

FOREIGN PATENT DOCUMENTS

| | | |
|---|---|---|
| EP | 450 840 | 10/1991 |
| JP | 62-9301 | 1/1987 |

OTHER PUBLICATIONS

M. P. Rao, et al., "Single-mask, three-dimensional microfabrication of high-aspect-ratio structures in bulk silicon using reactive ion etching lag and sacrificial oxidation," applied Physics Letters, vol. 85, No. 25, Dec. 20, 2004, pp. 6281-6283.

* cited by examiner

*Primary Examiner* — Cynthia Kelly
*Assistant Examiner* — Anna Verderame
(74) *Attorney, Agent, or Firm* — J. Lanny Tucker

(57) ABSTRACT

The invention relates to a process for forming a structure comprising providing a support, coating one side of said support with a colored mask, coating a layer photopatternable by visible light, and exposing the layer through the colored mask with visible light to photopattern the layer.

19 Claims, 9 Drawing Sheets

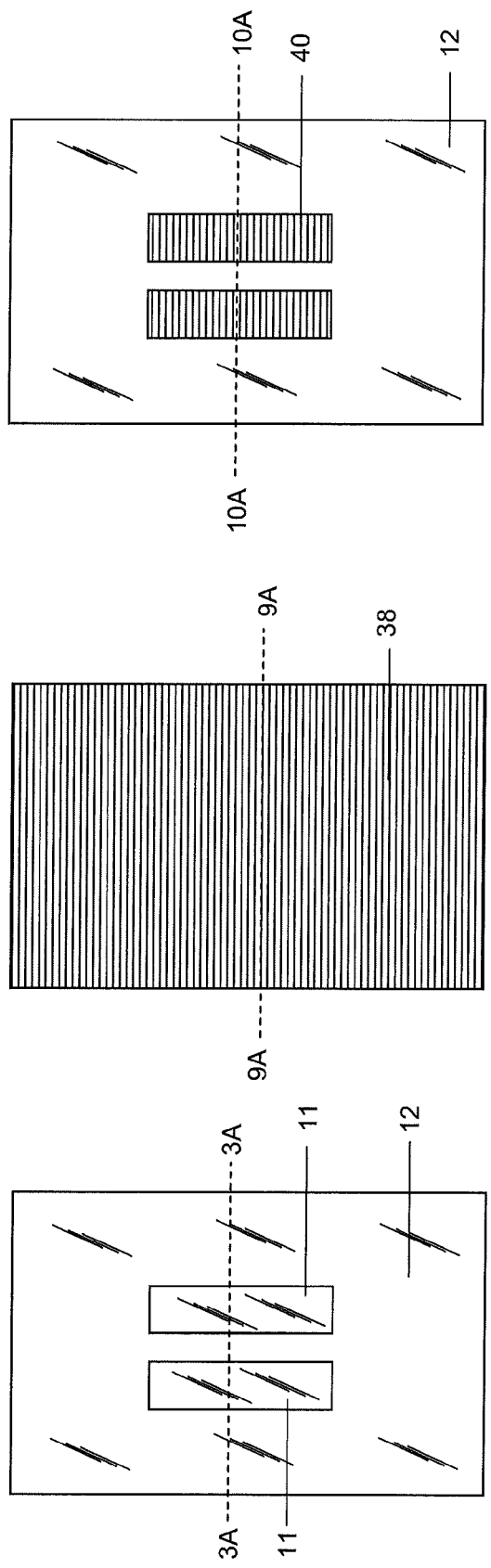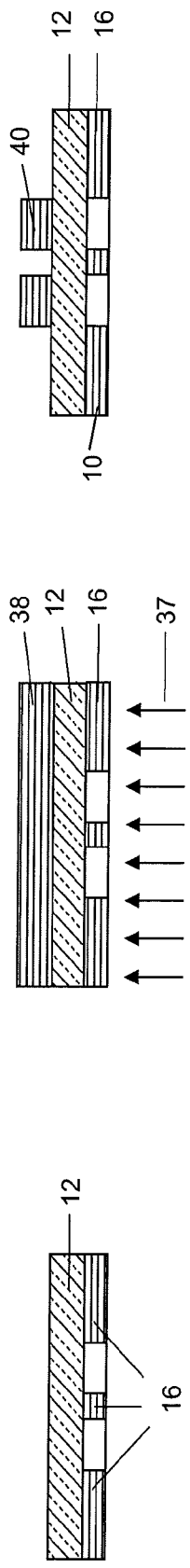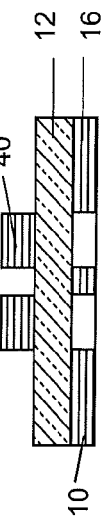

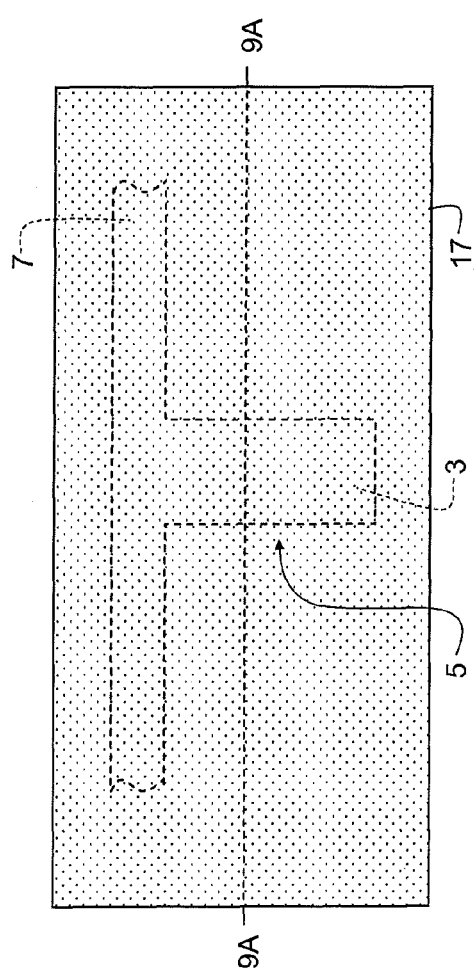
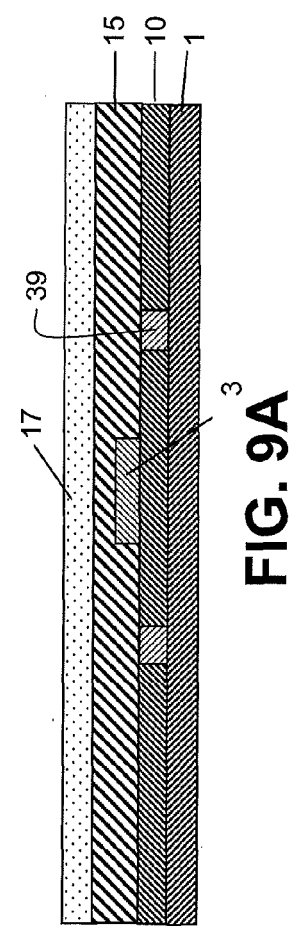
FIG. 9
FIG. 9A

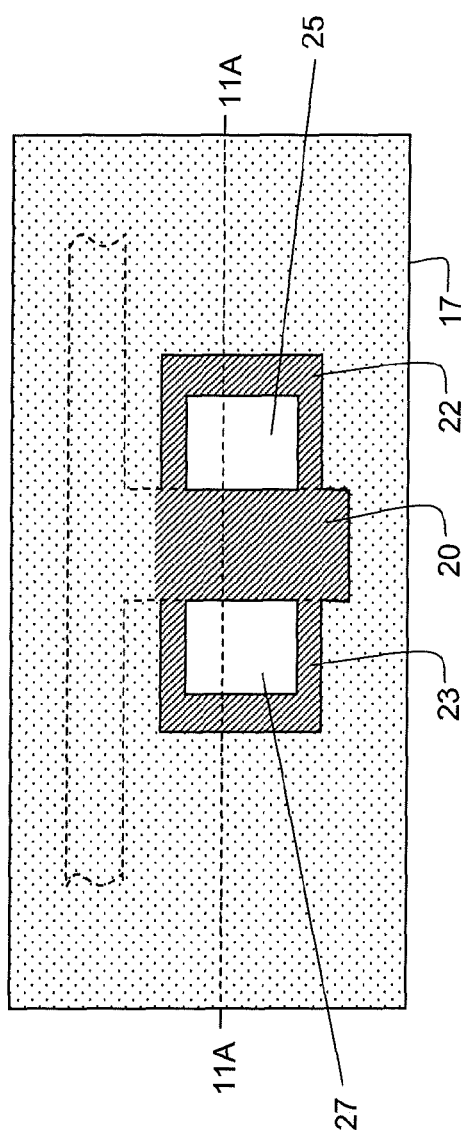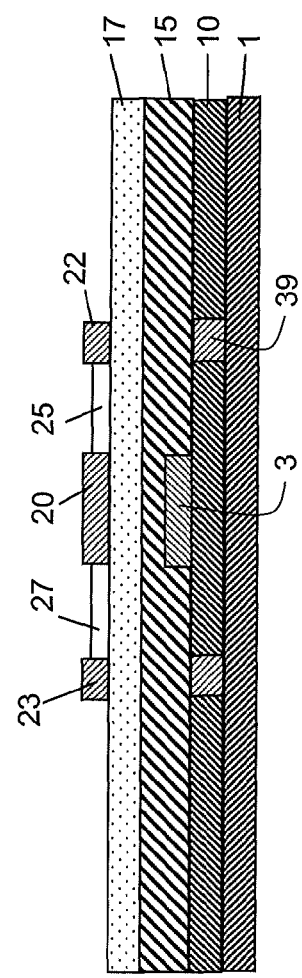
FIG. 11
FIG. 11A

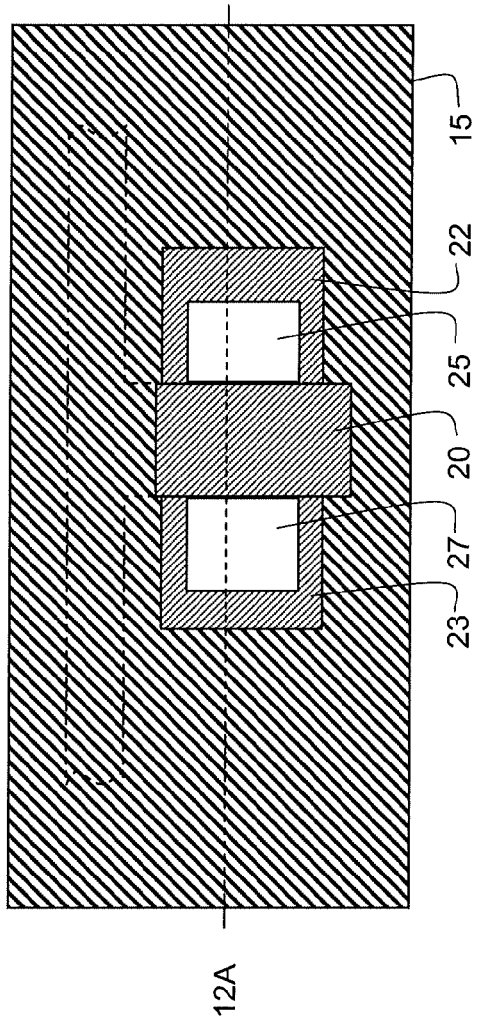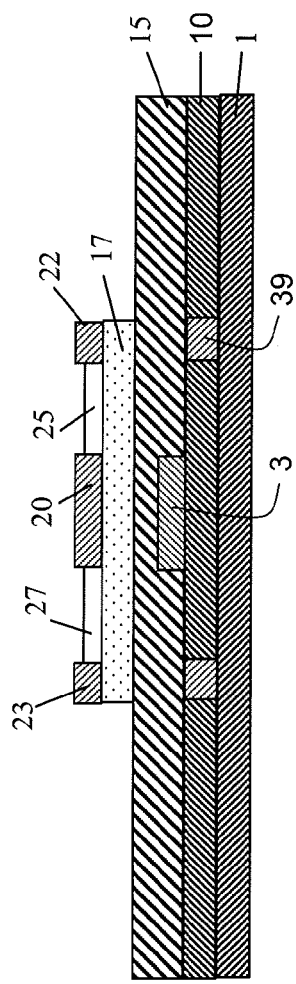
FIG. 12
FIG. 12A

INTEGRATED COLOR MASK

CROSS-REFERENCE TO RELATED APPLICATIONS

Reference is made to commonly assigned U.S. patent application Ser. No. 11/437,923 filed May 19, 2006 by Irving et al, and entitled "COLORED MASKING FOR FORMING TRANSPARENT STRUCTURES," U.S. application Ser. No. 11/986,169, filed concurrently by Irving et al, and entitled, "COLORED MASK COMBINED WITH SELECTIVE AREA DEPOSITION," U.S. Pat. No. 7,846,644, filed concurrently by Irving et al, and entitled "PHOTOPATTERNABLE DEPOSTION INHIBITOR CONTAINING SILOXNE," U.S. application Ser. No. 11/986,189, filed concurrently by Irving et al, and entitled, "GRADIENT COLORED MASK," U.S. application Ser. No. 11/986,155, filed concurrently by Irving et al, and entitled, "COLORED MASK FOR FORMING TRANSPARENT STRUCTURES STRUCTURS," U.S. application Ser. No. 11/986,102, filed concurrently by Irving et al, and entitled, "MULTICOLOR MASK," and U.S. application Ser. No. 11/986,088, filed concurrently by Irving et al, and entitled, "MULTICOLORED MASK PROCESS FOR MAKING DISPLAY CIRCUITRY," all the above-identified applications incorporated by reference in their entirety.

FIELD OF THE INVENTION

The invention relates to a colored masking technique useful for forming electrical and optical components.

BACKGROUND OF THE INVENTION

Manufacture of many electronic components, including flat panel displays, RFID tags, and various sensing applications, relies upon accurately patterning layers of electrically active materials applied to a relatively large substrate. These products are composed of several layers of different patterned materials, where it is important the layers be in specific registration. The reasons for patterning accuracy are twofold. First of all, patterned features must be reproduced across large areas of a substrate while having precise control over their dimensions. Secondly, products built with these features typically are composed of several layers of different, but interacting patterned layers, where it is important that the layers be in specific registration or alignment.

Traditionally, the precise layer alignment required for fabrication of electronic components and devices is accomplished using conventional photolithography. An electrically active layer and a photoresist layer are deposited on a substrate, the position of an existing pattern on the substrate is detected, and an exposure mask is aligned to that existing pattern. The photoresist is exposed, developed, and the electrically active material is etched. Small variations in temperature and humidity in this precise operation may be enough to introduce alignment errors; rigid glass substrates are used with stringent environmental controls to reduce these variations. At the other extreme, conventional printing techniques such as offset lithography, flexography, and gravure printing also apply multiple layers at extremely high speeds, although at substantially lower overlay accuracy.

There is a growing interest in advancing printing technology toward fabrication of thin film electrical components (such as TFTs) on flexible or plastic substrates. These substrates would be mechanically robust, lighter weight, and eventually lead to lower cost manufacturing by enabling roll-to-roll processing. In spite of the potential advantages of flexible substrates, there are many issues affecting the performance and ability to perform alignments of transistor components across typical substrate widths up to one meter or more. In particular, for example, the overlay accuracy achievable using traditional photolithography equipment can be seriously impacted by substitution of a flexible plastic substrate for the rigid glass substrates traditionally employed. Dimensional stability, particularly as the process temperature approaches the transition glass temperature (Tg) of the substrate, water and solvent swelling, anisotropic distortion, and stress relaxation are all key parameters in which plastic supports are inferior to glass.

Typical fabrication involves sequential deposition and patterning steps. Three types of registration errors are common in these fabrication processes: fixed errors, scale errors, and local misalignments. The fixed error, which refers to a uniform shift of one pattern to another, is typically dominated by the details of the motion control system. Specifically, mechanical tolerances and details of the system integration ultimately dictate how accurately the substrate may be aligned to a mask, or how accurately an integrated print device may be positioned with respect to a registration mark on a moving web. In addition to fixed errors, scale errors may also be substantial. Errors in pattern scale are cumulative across the substrate and arise from support dimensional change, thermal expansion, and angular placement errors of the substrate with the patterning device. Although the motion control system impacts angular placement, pattern scale mismatch is largely driven by the characteristics of the support. Thermal expansion, expansion from humidity or solvent exposure, shrinkage from high temperature exposure, and stress relaxation (creep) during storage of the support all contribute to pattern scale errors. Further, local pattern mismatch arising from nonisotropic deformations may also occur, particularly since the conveyance process involves applying tension. A flexible support used in roll-to-roll manufacturing will typically stretch in the conveyance direction and narrow in width.

There are several approaches to address the registration problem for fabrication of electronics on flexible substrates, but at this point a leading methodology has yet to emerge. Attach/detach technology has been explored by French et al. wherein a flexible substrate is laminated to a rigid carrier and runs through a traditional photolithographic process (I. French et al., "Flexible Displays and Electronics Made in AM-LCD Facilities by the EPLaRTM Process" SID 07 Digest, pp. 1680-1683 (2007)). Unfortunately, these technologies ultimately produce a flexible electronic component only with the cost structure of current glass based processing. Active alignment systems to detect previously existing patterns and compensation schemes for deformation have also been suggested in U.S. Pat. No. 7,100,510 to Brost et al. With this approach, instead of attaining accurate pattern overlay by maintaining tight specs on support dimensional stability and strict environmental control, the motion control system performs multiple alignments per substrate to compensate for distortion. One problem with the proposed solution of Brost et al. is that, for fabrication of transparent electronic structures, the transparency of the materials makes it substantially more difficult to use image analysis algorithms to detect and compensate for distortion.

A different approach to reducing the number of masks has been to develop single-mask processes in which different features are controlled by other process parameters. One example of this approach can be seen from "Single-mask, three-dimensional microfabrication of high-aspect-ration structures in bulk silicon using reactive ion etching lag and sacrificial oxidation," by Rao et al. (Appl. Phys. Lett. 85, 25, p 6281 (2004)). By using the lag in reactive ion etching, Rao et al. were able to achieve different surface profiles using only a single lithographic patterning step. Fast recovery diodes (FREDs) have also been made using a single-mask process, as disclosed by Bol et al. in U.S. Pat. No. 6,294,445. Neither Bol et al. nor Rao et al. anticipate using a substrate that could distort with processing conditions, and, as such, a single fixed mask was adequate for their processes. For similar structures made on flexible substrates, or other simpler structures such as wells useful for making color filters by inkjet printing, alternative masking technologies may be needed.

Another approach, which would potentially enable high speed processing with low capital investment, is to employ a self-aligning fabrication process. In a self-aligning process, a template for the most critical alignments in the desired structure is applied in one step to the substrate and from that point forward alignment of subsequent layers is automatic. Various methods have been described for fabricating self-aligned TFTs. Most of these methods allow self-alignment of one layer to another layer, but do not significantly remove the need for very sophisticated alignment steps between several layers. For example, the gate electrode in some a-Si TFT processes is used as a "mask" to protect the channel area from doping and laser annealing of the silicon on either side of the channel region. The concept of self-aligned fabrication can be understood from U.S. Pat. No. 5,391,507 by Kwasnick et al., U.S. Pat. No. 6,338,988 by Andry et al., and US Patent Publication No. 2004/229,411 by Battersby.

One published technique offering the potential for a fully self aligned process that eliminates the need for complex registration is Self-aligned Imprint Lithography (SAIL), as illustrated in U.S. Pat. No. 7,056,834 by Mei et al. In imprint lithography, a variable-thickness resist is prepared on the electronically active layers and a sequencing of chemical etch and materials deposition is matched to controlled erosion of the photoresist to produce TFT structures. There are difficulties with the SAIL process, however. First, a robust nanoimprint technology is needed for webs. Second, the SAIL process requires high accuracy etch depth control, which may not be consistent with a low cost process. Finally, a significant limitation of the SAIL process is that layers produced by the mask cannot be fully independent. As an example, it is particularly challenging to form openings under continuous layers with this approach, an essential element in a matrix backplane design.

There is a growing interest in depositing and patterning thin film semiconductors, dielectrics, and conductors on flexible substrates, particularly because, as mentioned above, these supports would be more mechanically robust, lighter weight, and potentially lead to more economical or practical manufacturing by allowing roll-to-roll processing. The present invention facilitates highly accurate patterning of materials coated on various supports, in a simple and advantageous way, and can solve one or more the aforesaid problems, even when using flexible or various other desired supports.

PROBLEM TO BE SOLVED BY THE INVENTION

The problems addressed by the current invention are to reproduce patterned features even across large areas while having precise control over the feature dimensions and the registration and alignment of patterned features that are in different layers. Additionally, it is highly desirable to overcome these problems in a way that does not require expensive equipment or expensive processes.

SUMMARY OF THE INVENTION

The invention generally is accomplished by a process for forming a structure comprising:
a) providing a transparent support having a front side and a back side;
b) forming a color mask, having a color pattern, on one side of the transparent support, either the front side or the back side;
c) coating a layer photopatternable material sensitive to visible light on the front side of the transparent support after forming the color mask;
d) exposing the layer of photopatternable material through the color mask with visible light to form a photopattern corresponding to the color pattern of the color mask wherein the photopattern is composed of photopatternable material changed to a second exposed state that is different from a first as-coated state; and
e) patterning a layer of functional material using the photopattern such that the layer of functional material has a resulting pattern that corresponds to the color pattern of the color mask, wherein the layer of functional material may be the layer of photopatternable material or a layer separate from the layer of photopatternable material, wherein the resulting pattern is formed by removal of an area of the layer of functional material or by selective area deposition of the layer of functional material.

In one embodiment, the process comprises:
a) providing a transparent support having a front side and a back side;
b) forming a color mask, having a color pattern, on one side of the transparent support, either the front side or the back side;
c) coating a layer photopatternable material sensitive to visible light on the front side of the transparent support after forming the color mask;
d) exposing the layer of photopatternable material through the color mask with visible light to form a photopattern corresponding to the color pattern of the color mask wherein the photopattern is composed of photopatternable material changed to a second exposed state that is different from a first as-coated state;
e) depositing a layer of functional material before or after coating the layer of photopatternable material; and
f) patterning the layer of functional material using the photopattern such that the layer of functional material has a resulting patterned layer of functional material that corresponds to the color pattern of the color mask.

In an alternate embodiment, a structure can be formed by a process comprising:
a) providing a transparent support;
b) forming a color mask having a color pattern on a first side of the transparent support;
c) coating a layer of functional photopatternable material sensitive to visible light on the first side of the transparent support after forming the color mask;
d) exposing the layer of functional photopatternable material through the color mask with visible light to form a photopattern corresponding to the color pattern of the color mask wherein the photopattern is composed of functional photopatternable material that has been changed to a second exposed state that is different from a first as-coated state, and
e) patterning the layer of functional photopatternable material such that the layer has a resulting patterned layer of functional material that is formed by removal of an area of the layer of photopatternable functional material corresponding to the photopattern.

Another aspect of the invention is directed to an article made by a process such as described above. In one embodiment, the article comprises a transparent support, a color mask having a color pattern on the transparent support, and a patterned layer of functional material on the same side of the transparent support as the color pattern, wherein the patterned layer of functional material is in register with the color pattern on the transparent support.

ADVANTAGEOUS EFFECT OF THE INVENTION

One advantage of the present invention is that it provides a method for forming patterned layers without the need for equipment and processes to compensate for substrate distortions. Another advantage is the color mask is prepared directly on the support ensuring that the correct mask is used. The color mask has the advantage of being physically close to the layer(s) to be pattern allowing for fine features to be patterned. Additionally, the color mask may be used in conjunction with other masking and patterning techniques to form more complicated structures. Because the color mask is prepared directly on the support and is fully viewable, the color mask serves to simplify critical alignments in fabrication, particularly for fabrication of transparent electronic structures.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical or analogous features that are common to the figures, and wherein:

FIGS. 1 and 1A show a pattern of red color absorber on a transparent support, both in plan view and cross-section of the plan view;

FIGS. 2-3A show a process for selectively forming a pattern of material registered with the red color absorber pattern of the color mask;

FIGS. 8 and 8A in which FIG. 8A is a cross-section of the structure of FIG. 8, show Step (b) of one embodiment of the present process, in which a dielectric material is deposited;

FIGS. 9 and 9A, in which FIG. 9A is a cross-section of the structure of FIG. 9, show Step (c) of one embodiment of the present process, in which a semiconductor material is deposited and patterned;

FIGS. 10A, 10B, and 10C, in which FIG. 10B is a cross-section of the structure of FIG. 10A and FIG. 10C is a planar view of the photomask shown in FIG. 10B, show Step (d) of one embodiment of the present process, in which a photopatternable photoresist layer is exposed through the color mask;

FIG. 11 and FIG. 11A, in which FIG. 11A is a cross-section of the structure of FIG. 11, show Step (f) of an embodiment of the present process, in which a source and drain electrode material is printed into a containment structure that is formed in the photoresist layer using the color mask of FIG. 10C;

FIG. 12 and FIG. 12A, in which FIG. 12A is a cross-section of the structure of FIG. 12, show Step (g) of an embodiment of the present process, in which the semiconductor layer is patterned to form a thin film semiconductor element.

DETAILED DESCRIPTION OF THE INVENTION

Figure 4:
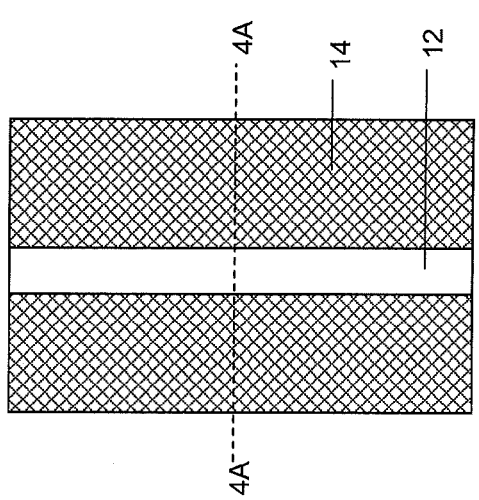
FIGS. 4 and 4A show a pattern of blue color absorber on a transparent support.

For ease of understanding, the following terms used herein are described below in more detail.

As utilized herein, the term "back" as applied to the invention article is the side of the support carrying the color mask; the term "front" as used herein refers to the side of the support opposite to the side carrying the mask.

"Vertical" means substantially perpendicular to the surface of a substrate.

"Transparent" generally denotes a material or construct that does not absorb a substantial amount of light in the visible portion (and/or infrared portion in certain variants) of the electromagnetic spectrum. In this invention, the transparency of a materials is only with reference to the colors of light that are being used in a particular process step. Transparent means at least 65% of the reference light passes through the member.

"Photopatternable" refers to a material that, upon exposure to light, changes state, for example in terms of solubility, tackiness, mechanical strength, permeability to etchants or gases, surface reactivity and/or index of refraction, such that the changed state allows patterning.

"Positive" refers to a pattern, which contains material in those areas above the colored parts of the photomask.

"Negative" refers to a pattern, which contains material in those areas above the transparent parts of the photomask.

A thin film transistor (TFT) is a likely electronic element that can benefit from the patterning process of this invention. The next three definitions refer specifically to thin film transistors.

As used herein, the terms "over," "above," and "under" and the like, with respect to layers in the thin film transistor, refer to the order of the layers with respect to the support, but do not necessarily indicate that the layers are immediately adjacent or that there are no intermediate layers.

"Gate" generally refers to the insulated gate terminal of a three terminal FET when used in the context of a transistor circuit configuration.

The preceding term descriptions are provided solely to aid the reader, and should not be construed to have a scope less than that understood by a person of ordinary skill in the art or as limiting the scope of the appended claims.

The process of this invention can be used to generate any variety of structures containing at least one patterned layer. This process is therefore capable of producing monolithically integrated structures that can be designed to function as conductors, inductors, capacitors, transistors, diodes, photodiodes, light emitting diodes, and other electronic or optoelectronic components. Furthermore, the patterning technology can be used to simultaneously produce a number of these devices arranged in a way to produce useful electronic circuitry.

As indicated above, one embodiment of the present process for forming a structure comprises: (a) providing a transparent support having a front side and a back side; (b) forming a color mask, having a color pattern, on one side of the transparent support, either the front side or the back side; (c)

coating a layer photopatternable material sensitive to visible light on the front side of the transparent support after forming the color mask; (d) exposing the layer of photopatternable material through the color mask with visible light to form a photopattern corresponding to the color pattern of the color mask wherein the photopattern is composed of photopatternable material changed to a second exposed state that is different from a first as-coated state; (e) depositing a layer of functional material before or after coating the layer of photopatternable material; and (f) patterning the layer of functional material using the photopattern such that the layer of functional material has a resulting patterned layer of functional material that corresponds to the color pattern of the color mask.

In one embodiment, there is no other color pattern of a different color, in any color mask formed on the transparent support that is used to form another patterned layer of functional material. Alternately, additional color patterns can be formed to produce a multicolor mask as disclosed in commonly assigned U.S. patent application Ser. No. 11/437,923 filed May 19, 2006 by Irving et al. and entitled "COLORED MASKING FOR FORMING TRANSPARENT STRUCTURES," and the following commonly assigned, concurrently filed US application Serial Numbers: U.S. application Ser. No. 11/986,155 by Irving et al. and entitled, "COLORED MASK FOR FORMING TRANSPARENT STRUCTURES," U.S. application Ser. No. 11/972,780 by Irving et al. and entitled "PHOTOPATTERNABLE DEPOSITION INHIBITOR CONTAINING SILOXANE," U.S. application Ser. No. 11/986,189 by Irving et al. and entitled, "GRADIENT COLORED MASK," U.S. application Ser. No. 11/986,102 by Irving et al. and entitled, "MULTICOLOR MASK," U.S. application Ser. No. 11/986,169 by Irving et al. and entitled, "COLORED MASK COMBINED WITH SELECTIVE AREA DEPOSITION," and U.S. application Ser. No. 11/986,088 by Irving et al. and entitled, "MULTICOLORED MASK PROCESS FOR MAKING DISPLAY CIRCUITRY," all the above-identified applications incorporated by reference in their entirety.

Also, it should be noted that it is not necessary that a single color mask be used to pattern only one layer. In fact, it would be preferable to use it to pattern multiple layers using different processes, but using the same color mask. The multiple layers could be all the same pattern or positive and negative patterns. Also, by using processing such as a reactive ion etch (RIE), multiple aligned structures/patterns with only a single mask can be obtained.

In this embodiment, the colored mask can remain in the structure or it can be subsequently removed. Subsequent to exposure, the photopatternable layer can be patterned in various ways. For example, an area of the layer of photopatternable material not exposed to the visible light can be removed prior to step (e).

The visible light utilized for exposing the layer of photopatternable material can have a light spectrum matching the color of the color pattern of the colored mask. Alternately, the visible light used for exposing the layer of photopatternable material can be white light, and the photopatternable material can be curable by a light spectrum matching the color of the color pattern of the colored mask. In one embodiment, the photopatternable material is changed to a second exposed state by visible light having a light spectrum matching the color of the color pattern of the color mask, and the visible light utilized for exposing the layer of photopatternable material also has the same color.

The process can further comprise the step of coating at least one more additional layer of functional material onto the previously said patterned layer of functional material and patterning said additional layer of functional material in register with the previously said patterned layer of functional material.

The patterned layer of functional material can be conductive, dielectric, or semiconductive, as explained in more detail below, which functional materials can be used to form useful components in electronic devices, such as electronic circuits, for example, for driving electronic displays.

In an alternate embodiment, in which a layer of functional photopatternable material sensitive to visible light is formed on a first side of the transparent support after forming the color mask on the same first side of the transparent support, a separate photoresist layer is not necessary. The layer of functional photopatternable material itself is exposed through the color mask with visible light to form a photopattern corresponding to the color pattern of the color mask. In this case, the color mask, support, and patterned functional material remain in the structure.

Again, in one embodiment, no other color pattern of a different color may be present, in any color mask formed on the transparent support that is used to form another patterned layer of photopatternable functional material. Alternatively, a single color pattern may used as part of a multicolor mask.

In one embodiment, accurate pattern overlay over large areas and on flexible supports is enabled by use of a color-encoded mask, which is prepared directly on the support, in combination with a spectrally sensitized photoresist. Transparent electronic materials are subsequently deposited in layer-by-layer fashion. Spectrally sensitized photoresist is selectively exposed through the color mask to form a photoresist pattern on the support, vertically aligned to the color mask. Patterning of an electrically active or otherwise functional layer may be accomplished by using an etch, liftoff, or selective deposition process to pattern the gate, dielectric, semiconductor, and source/drain, or other layer in the electronic structure being made for use in an electronic device. Similarly, an optically active layer may be patterned using the same process. The color mask can be considered part of the substrate and is formed on either side of the substrate—either the side with the active layers or the side opposite the active layers of the structure being made. The color mask contains pattern information for at least one of the layers in a process. Fabrication using the present invention is self compensating for errors arising from dimensional change of supports.

In a preferred embodiment of the present invention, the color mask remains as part of the final device. These embodiments will be better understood with respect to the figures.

The figures and following description illustrate a masking scheme of the current invention. The illustrative example of this description utilizes a single color mask composed of a color absorbing material, and utilizes photopatternable materials, sensitive to colored light, to pattern a transparent functional layer. The figures are intended to illustrate the present invention and should not be considered limiting.

Light used for exposing can be panchromatic or colored. Panchromatic light refers to light that has some spectral intensity over the visible spectrum. Panchromatic light should be recognized by one skilled in the art as light that contains multiple colors. Colored light generally refers to light that has high intensity in certain spectral regions and lower intensities in others. Colored light can be described by the wavelength of the maximum intensity ($\lambda_{max}$) and by the FWHM (full width at half the maximum), or by the bandpass. Color patterns may be described by their absorbance as a function of wavelength, or by their absorption spectral range. The absorption spectral range for a typical color pattern is defined for the purposes of this disclosure as the wavelengths where the absorbance value is in the range of the maximum absorbance to 10% of the maximum absorbance. Preferred color absorbers are those materials with maximum absorption in a selected portion of the visible band and maximum transmission in remaining portions.

Referring now to the figures, FIGS. 1 and 1A show a plan view and cross-sectional view, respectively, of a color mask as a pattern of a red color absorber (16) with mask openings (11) on transparent support (12). FIGS. 1 and 1A also illustrate an embodiment of the present invention where the color mask is on the backside of the support. An important aspect of the present invention is that the color mask is either formed on the support or acts as part of the support. This is important because the entire article, including support (12) may be exposed to varying temperature, pressure, solvent and humidity treatments during the fabrication and coating steps, naturally leading to variations in dimension (such as shrinkage or thermal expansion) of the support. Web transport systems apply tension to the support, leading to dimensional instability as well. In fact, the lowest cost and potentially cheapest support materials are likely to have a higher degree of dimensional instability. For example, polyester film has a thermal expansion coefficient of 0.0018% per ° C., such that a 5° C. change will result in a dimensional change of 90 µm over 1 meter. The effect of humidity expansion and thermal expansion need not lead to cumulative and catastrophic alignment errors when a color mask element (10) is provided, in a preferred embodiment used with a self-aligned process. Simply, the patterning information is contained in the color absorbing layer that is attached to the support, and thus remains in fixed vertical alignment as the support shrinks or expands.

FIGS. 2-3A and 5-6A show processes for selectively forming patterns of photopatternable material registered with the color absorber pattern of color mask (10). A photopatternable layer (18) with a sensitivity corresponding to the color of the mask is coated on the support, over the color mask. This photopatternable layer (38) is exposed with light through the color mask. The color absorber of the color mask selectively transmits the illuminating light, thereby exposing the photopatternable layer to a pattern of colored light. For example, a cyan mask absorbs red light while transmitting blue and green light. Similarly, a magenta mask absorbs green light while transmitting red and blue light and a yellow mask absorbs blue light while transmitting red and green light. The sensitivity distribution of the photopatternable layer, in a preferred embodiment, is completely contained within the absorption spectrum of the color absorbing material used in the color mask (10). In a preferred embodiment of the invention, the photopatternable layer contains either a polymerizable compound or a photosolubilizable matrix and a photoinitiator responsive only to specific wavelengths of colored light. Absorption of colored light by the photoinitiator initiates the photopolymerization or photosolubilization reaction. The photopatternable layer may contain additional components that include but are not limited to polymeric binders, fillers, pigments, surfactants, adhesion modifiers, antioxidants, co-initiators, chain transfer agents, and the like. One convenient way to modify the sensitivity distribution of the photopatternable layer is with the identity of the photoinitiator. The spectral distribution of illuminating light may be specifically selected to minimize effects from unwanted absorption of the color absorbing material and/or unwanted sensitivity of the photopatternable layer. Following exposure, the photopatternable layer is developed. The remaining pattern may be the positive image of the mask layer, or the negative pattern depending on the type of photopatternable material used.

FIGS. 2-3A show a process for selectively forming a pattern of material registered with the red color absorber pattern of the color mask. FIGS. 2 and 2A illustrate a support with color mask (10) that has been coated with a red photopatternable material (38) and exposed with a light source containing red light. This light source may be a white light, or panchromatic light, source. In this embodiment, the photopatternable material of the photopatternable layer is negative working. FIGS. 3 and 3A show the resulting structure after the exposed red photopatternable material from FIG. 2 has been developed, forming a photopattern of photopatternable material (40) registered with the red color absorber pattern (16) of color mask (10).

Figure 4A:
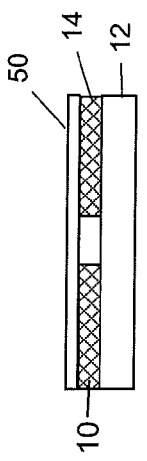

FIGS. 4 and 4A illustrate an embodiment of the present invention having the color mask on the front side of the support. As shown in FIGS. 3 and 3A the color mask consists of pattern of a blue color absorber (14) on transparent support (12). FIG. 4 also illustrates an embodiment of the present invention having an optional transparent coating 50 on the top surface of the color mask. The transparent coating 50 may have insulating, smoothing, planarizing or other properties that improve the performance of the end device that will be formed over the color mask 10.

Figure 5:
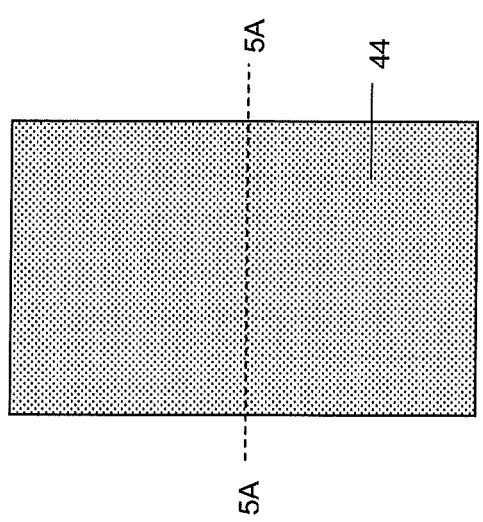
FIGS. 5-6A show a process for selectively forming a pattern of material registered with the blue color absorber pattern of the color mask.
Figure 5A:
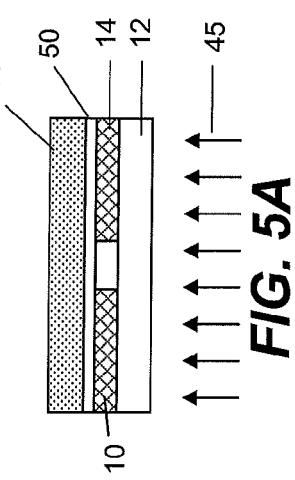
Figure 6:
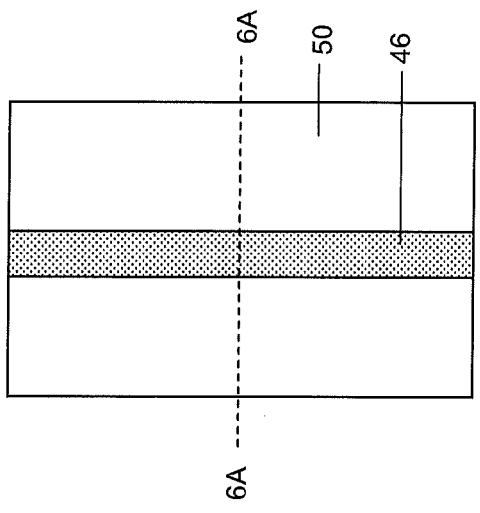
Figure 6A:
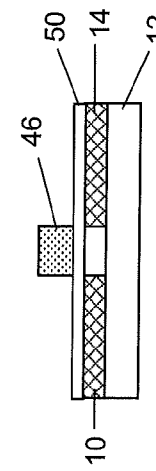

FIGS. 5-6A show a process for selectively forming a pattern of material registered with the blue color absorber pattern of the color mask (10). Referring now to FIGS. 5 and 5A, there is illustrated the color mask (10) that has been coated with a blue photopatternable layer (44) and exposed with a light source containing blue light. This light source may be a white light or panchromatic light. In this embodiment, the photopatternable material of the photopatternable layer is negative working. FIGS. 6 and 6A show the resulting structure after the exposed blue photopatternable material from FIG. 5 has been developed, forming a photopattern of blue photopatternable (46) registered with the blue color absorber pattern (14) of color mask (10).

In another embodiment of the present invention, the photopatternable material may be pan-sensitive. This embodiment can be understood with respect to previous Figs. The patterned structures are formed by changing the color of exposing light through the color mask and employing a photopatternable material sensitive to panchromatic light. The pan-sensitive film may be formulated, for example, containing a polymerizable compound and a mixture of red, green, and blue responsive photoinitiators. When a pan-curable film is used with the present invention, the pattern to be formed is selected by adjusting the spectral energy distribution of the exposing light. Therefore, the absorption spectrum of the color absorbing material for the intended pattern should match the wavelength of exposing light.

Figure 7:
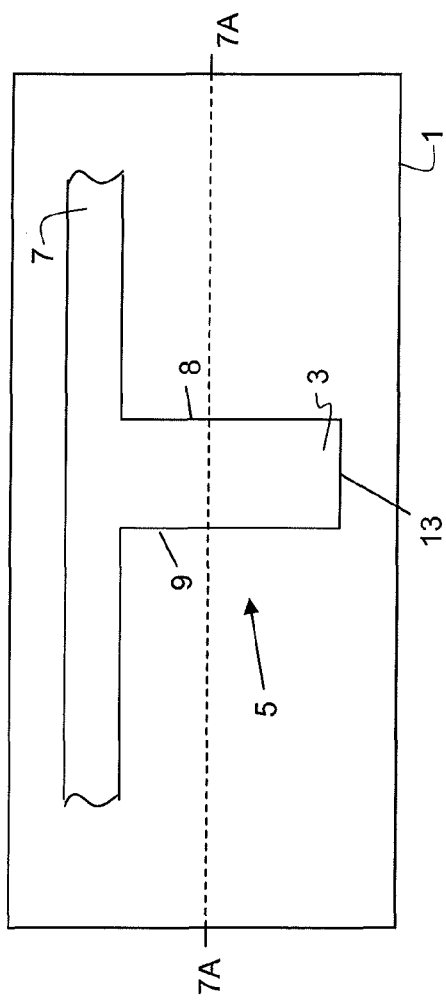
FIGS. 7 and 7A in which 7A is a cross-section of the structure of FIG. 7, show Step (a) of one embodiment of the present process, in which a gate material is deposited and patterned.
Figure 7A:
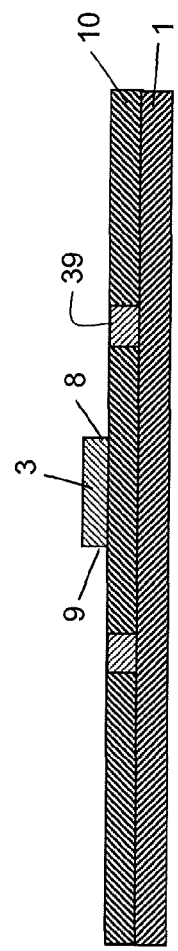

In one preferred embodiment of the present invention, the color mask is used in forming a thin-film transistor (TFT) by a version of a self-aligned process. Self-aligned processes for forming TFTs can be better understood with respect to commonly assigned U.S. patent application Ser. Nos. 11/757,578 and 11/757,633, which are hereby incorporated by reference. Referring now to FIG. 7 and FIG. 7A, wherein FIG. 7A is a cross-section of the structure of FIG. 7 taken along line 7A-7A of FIG. 7. Step (a) of the self-aligned process is illustrated, involving formation of a gate structure (electrode), preferably a metal, on a support or substrate 1. As shown in FIG. 7A, support 1 has a color mask 10 formed on the front side of substrate 1. This should not be considered limiting, as color mask 10 may be formed on the backside of substrate 1. Step (a) involves depositing and patterning a layer of conductive material on substrate 1 to form a patterned gate-bus structure 5 comprising gate electrode 3 and bus line 7, in the case of a plurality of gate structures along a common bus line 7. Patterned gate-bus structure 5 is aligned with color mask 10. The bus line 7 can be connected to additional gate electrodes (not shown) along the continuation of bus line 7 on the substrate 1. The gate material can be simultaneously or sequentially deposited and patterned by various methods. For example, a metal can be evaporated using shadow mask to form a patterned structure. Alternately, a conductive coating can be applied, followed by photolithographic etching to form a patterned conductive structure. Still another method involves a pholithographic lift-off process, in which a conductive coating is applied over a pre-formed photoresist pattern, then the photoresist is removed to lift off the conductive areas that were located on top. Still another method of forming the gate-bus structure 5 involves applying a conductive material in the form of a fluid composition by inkjet printing (usually followed by annealing), thereby forming a patterned structure. For example, a fluid composition comprising silver nanoparticles in a solvent can be applied to the substrate and subsequently dried, optionally with annealing or other treatment to activate the conductive material. In another embodiment, the gate-bus structure 5 is formed by evaporatively depositing chrome metal through a shadow mask. Still another method involves adhesion transfer of a patterned conductive structure from a transfer material, for example, a composite multilayer structure, to the substrate 1.

In the embodiment of FIGS. 7 and 7A, the gate-bus structure 5 comprises a gate electrode 3 in the form of a peninsula, formed by three sides of a rectangle, that diverges substantially perpendicularly from the bus line 7. Thus, the gate electrode 3 in FIGS. 7 and 7A comprises first and second elongated sides 9 and 8 and terminal end 13.

The gate electrode can be made of any useful conductive material that blocks or attenuates actinic radiation used for any subsequent photopatterning operations. A variety of gate materials known in the art, are also suitable, including metals, degenerately doped semiconductors, conducting polymers, and printable materials such as carbon ink, silver-epoxy, or sinterable metal nanoparticle suspensions. For example, the gate electrode may comprise doped silicon, or a metal, such as aluminum, chromium, gold, silver, nickel, copper, tungsten, palladium, platinum, tantalum, and titanium. In an alternative embodiment, the gate material may be colored to allow selective transmission of a preselected spectrum of actinic radiation. Conductive polymers also can be used, for example polyaniline, poly(3,4-ethylenedioxythiophene)/poly(styrene sulfonate) (PEDOT:PSS). In addition, alloys, combinations, and multilayers of these materials may be useful.

The thickness of the gate electrode may vary, and according to particular examples it can range from about 20 to about 1000 nm. The gate electrode may be introduced into the structure by chemical vapor deposition, sputtering, evaporation and/or doping, or solution processing.

Figure 8:
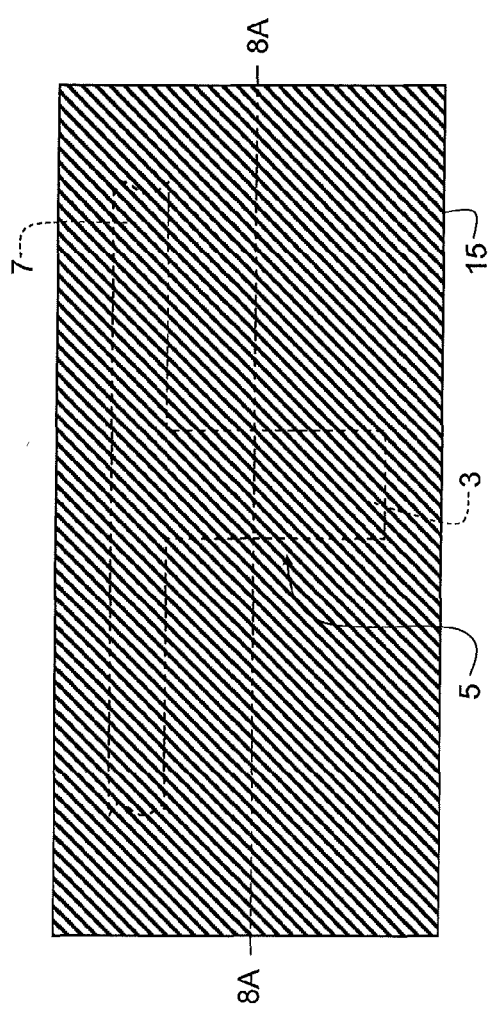
Figure 8A:
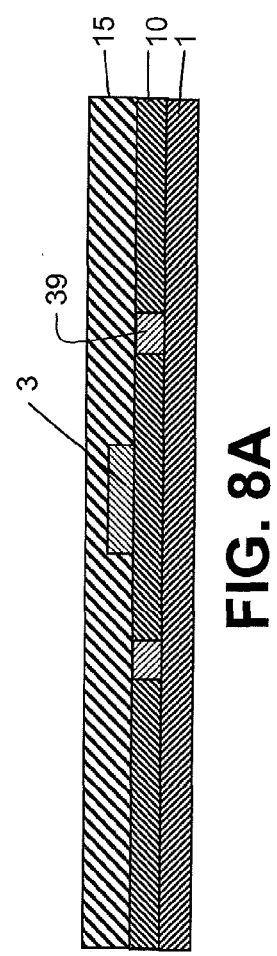

FIGS. 8 and 8A, in which FIG. 8A is a cross-section of the structure of FIG. 8 taken along the line 8A-8A of FIG. 8 illustrates a subsequent Step (b) of the present embodiment, directed to formation of a gate dielectric layer 15. A gate dielectric material is applied over the previous structure comprising substrate or support 1 and gate-bus structure 5, to form an unpatterned dielectric layer 15, best shown in cross-section in FIG. 8A.

The dielectric material can, for example, be plasma enhanced chemical vapor deposition of silicon nitride. Atmospheric chemical vapor deposition processes as disclosed in U.S. application Ser. No. 11/620,738 and US Publication No. 2007/0238311, hereby incorporated by reference in their entirety, may be used to deposit an inorganic oxide such as aluminum oxide. Other materials may be used, which can be applied by various means known to the skilled artisan.

The gate dielectric is provided in contact with the gate electrode. This gate dielectric electrically insulates the gate electrode from the balance of the TFT device. Thus, the gate dielectric comprises an electrically insulating material. The gate dielectric should have a suitable dielectric constant that can vary widely depending on the particular device and circumstance of use. For example, a dielectric constant from about 2 to 100 or even higher is known for a gate dielectric. Useful materials for the gate dielectric may comprise, for example, a transparent inorganic electrically insulating material. The gate dielectric may comprise a transparent polymeric material, such as polyvinylidenedifluoride (PVDF), cyanocelluloses, polyimides, etc. The gate dielectric may comprise a plurality of layers of different materials having different dielectric constants.

Specific examples of materials useful for the gate dielectric include strontiates, tantalates, titanates, zirconates, aluminum oxides, hafnium oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of these examples can be used for the gate dielectric. Of these materials, aluminum oxides, hafnium oxides, silicon oxides, and zinc selenide are preferred. In addition, polymeric materials such as polyimides, polyvinyl alcohol, poly(4-vinylphenol), polyimide, and poly(vinylidene fluoride), polystyrene and substituted derivatives thereof, poly(vinyl naphthalene) and substituted derivatives, and poly(methyl methacrylate) and other insulators having a suitable dielectric constant.

The gate dielectric can be provided in the TFT as a separate layer, or formed on the gate such as by oxidizing the gate material to form the gate dielectric (not shown). The dielectric layer may comprise two or more layers having different dielectric constants (not shown). Such insulators are discussed in U.S. Pat. No. 5,981,970 by Dimitrakopoulos et al. hereby incorporated by reference and copending US Publication No. 2006/0214154, hereby incorporated by reference. Gate insulator materials typically exhibit a band-gap of greater than about 5 eV.

The thickness of the gate insulator layer may vary, and according to particular examples it can range from about 10 to about 300 nm. The gate dielectric layer may be introduced into the structure by techniques such as chemical vapor deposition, sputtering, atomic layer deposition, or evaporation, solution.

Referring now to FIG. 9 and FIG. 9A, in which FIG. 9A is a cross-section of the structure of FIG. 9 taken along the line 9A-9A of FIG. 9, there is illustrated a subsequent Step (c) of the present embodiment, directed to formation of a semiconductor film. A transparent semi-conducting material is applied, for example, by inkjet printing, spin coating, chemical vapor deposition, atomic layer deposition, or the like, thereby forming the semiconductor film 17 over the gate dielectric layer 15 and gate-bus structure 5. Various embodiments for coating the transparent semiconductor film are described in more detail below.

Figure 10A:
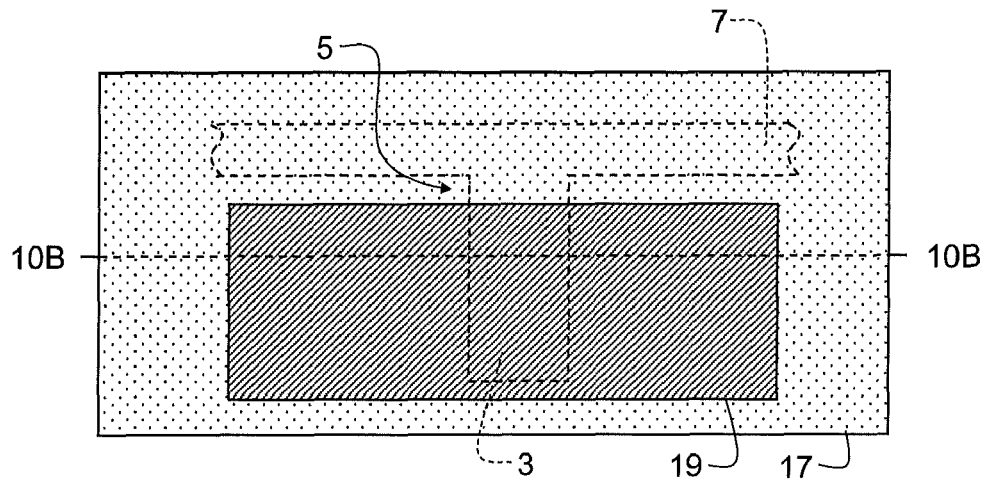
Figure 10B:
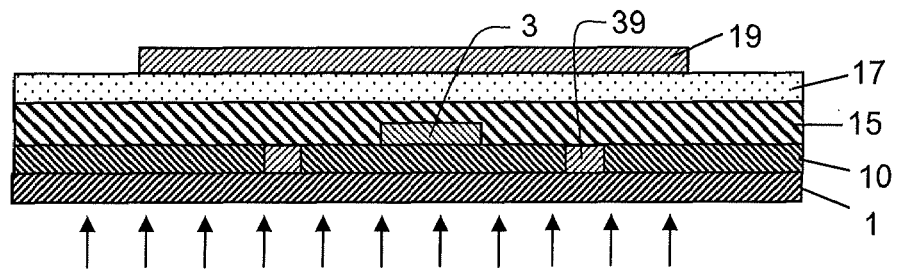
Figure 10C:
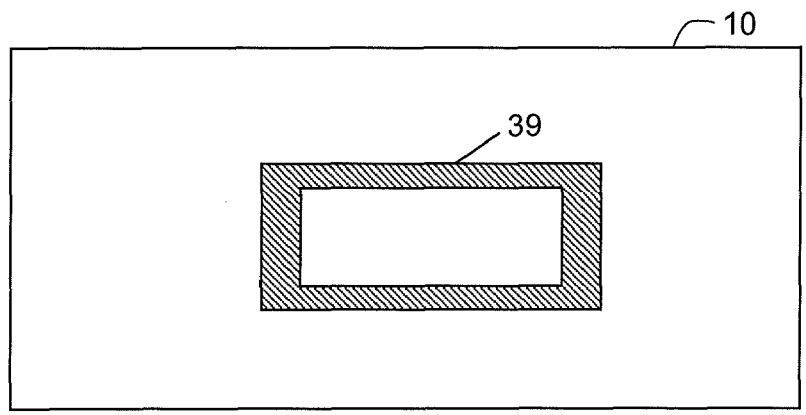

Referring to FIG. 10A and FIG. 10B, in which FIG. 10B is a cross-section of the structure of FIG. 10A taken along the line 10B-10B of FIG. 10A, and FIG. 10C shows a plan view of the color mask 10 shown in side view in FIG. 10B. In Step (d) of the present embodiment the partially patterned photoresist layer 19 is exposed from the substrate or support side through the color mask 10 having masked portion 39 in the form of (in this particular embodiment) a frame. Other shapes for the masked portion 39 of color mask 10 may be employed, for example, parallel bars, as will be appreciated by the skilled artisan in view of the above description of alternate shapes and sizes for the outer containment elements that are produced using the masked portion 39.

Based on the frame shape of FIG. 10C, however, a photo-patterned photoresist layer 20 is produced as shown in FIG. 11, wherein both Step (e) and (f) are illustrated. The photo-patterned photoresist layer 19 forms not only a central portion or passivation layer 20, but also outer containment elements 22 and 23. The skilled artisan will readily appreciate that, were a slightly different photomask used in Step (e), then a different photopattern could have been obtained. In this embodiment of FIGS. 11 and 11A, however, the photopattern overall forms continuous side barriers to an applied fluid for the source and drain, without gaps in the barriers. An aligned containment element, however, has at least one, preferably three sides, opposed to the side formed by the passivation structure 20 covering the semiconductor element. The fluid containment elements 22 and 23 can be in other shapes, including a straight bar or an L shape. In Step (f), as illustrated in FIGS. 11 and 11A the source and drain is shown surrounded on more than one side, in this case on all four sides, by the photopatterned passivation layer 20 in combination with the outer containment elements 22 and 23.

Finally, Step (g) is illustrated in FIGS. 12 and 12A, in which FIG. 12A is a cross-section of the structure of FIG. 12 taken along the line 12A-12A of FIG. 12. In Step (g) of this embodiment the continuous semiconductor film 17 is patterned by employing a fluid composition, for example an acid-etch solution, capable of removing unprotected transparent semiconductor material. Since the source and drain material and the developed photoresist layer (both the passivation layer 20 and the containment elements 22 and 23) are immune from the acid-etch solution or the like, the outer boundaries of the semiconductor film 17 is aligned with the source and drain boundaries only where not surrounded by the containment elements 22 and 23. Otherwise, outer boundaries of the semi-conductor film are aligned with the outer containment elements 22 and 23.

Figure 13:
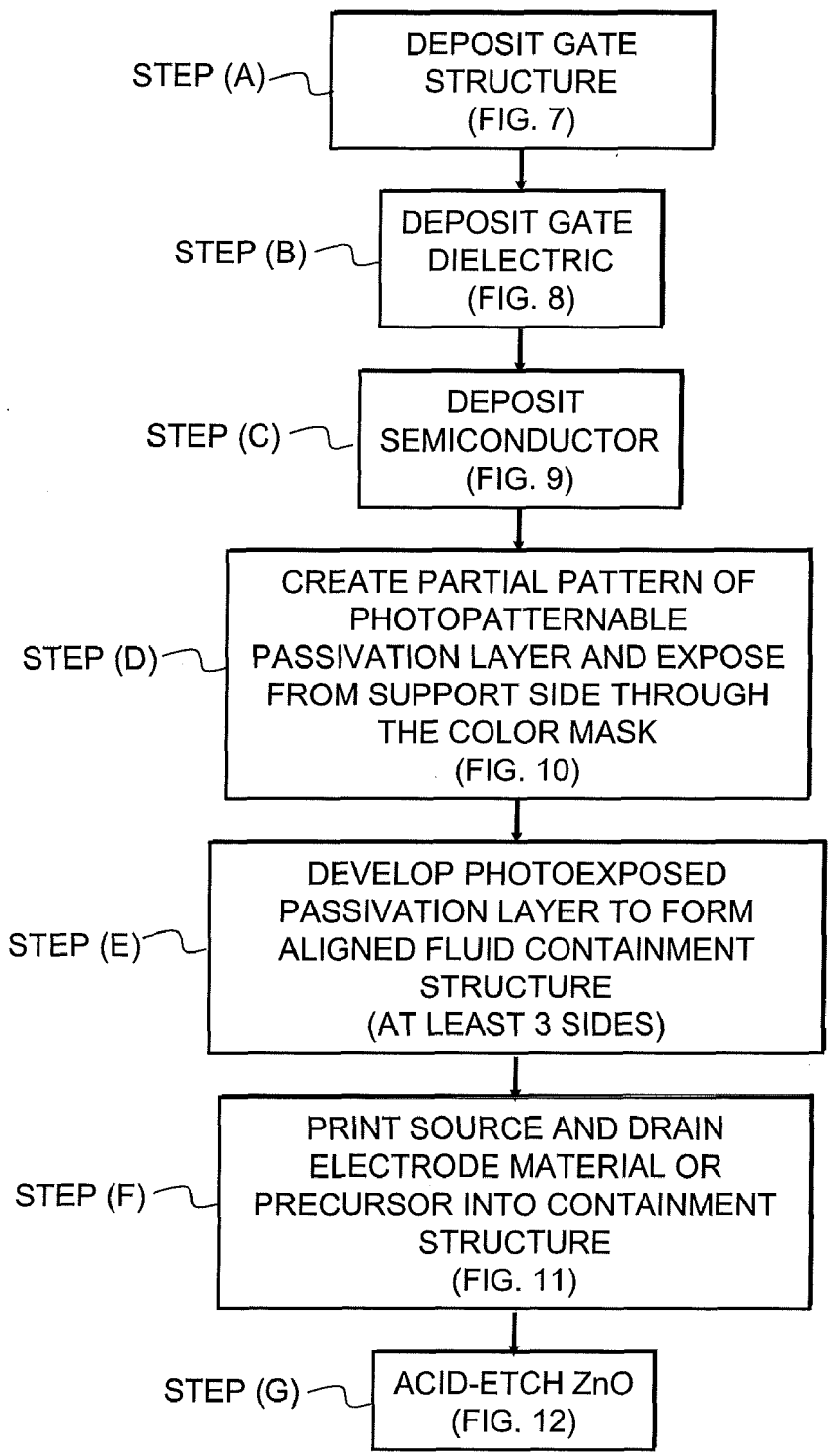
FIG. 13 shows a process flow diagram summarizing embodiments for self-aligned processes in combination with a color mask of the present invention

A process flow diagram which summarizes the first, second, and third embodiments illustrating the present invention is shown in FIG. 13. Each of the boxes corresponds to one of the Steps (a) to (g) of the process and are self-explanatory. Additional embodiments of the present invention using self-aligned TFT processes in combination with a color mask can be understood with respect to commonly assigned U.S. patent application Ser. No. 11/757,578, which was previously incorporated by reference. In particular, the transparent semiconductor layer may be applied in a pattern rather than a continuous layer. Additionally, the photopatternable material may be applied continuously. In embodiments where the transparent semiconductor layer is applied in a pattern and the photopatternable material is applied continuously, step (g) as described above may be omitted as shown in FIG. 13.

The entire process of making the thin film transistor or electronic device of the present invention, or at least the production of the thin film semiconductor, can be carried out below a maximum support temperature of about 200° C., more preferably below 150° C., most preferably below about 140° C., and even more preferably below about 100° C., or even at temperatures around room temperature (about 25° C. to 70° C.). The temperature selection generally depends on the support and processing parameters known in the art, once one is armed with the knowledge of the present invention contained herein. These temperatures are well below traditional integrated circuit and semiconductor processing temperatures, which enables the use of any of a variety of relatively inexpensive supports, such as flexible polymeric supports. Thus, the invention enables production of relatively inexpensive circuits containing thin film transistors with significantly improved performance. One embodiment of the present invention is directed to a process for fabricating a thin film transistor, preferably by deposition of the semiconductor thin film onto a substrate, preferably wherein the substrate temperature is at a temperature of no more than 200° C. during the deposition.

Additional applications of the color mask of the present invention include any process utilizing transparent materials and a single mask. For example, one embodiment of the present invention includes single mask processing for forming FREDs, which can be understood with respect to U.S. Pat. No. 6,294,445 by Bol et al. Additional single mask processes include three-dimensional microfabrication using reactive ion etching lag, see Rao et al cited above. The color mask may be employed to form barrier ribs aligned to the color mask. The color mask may be used to pattern multiple layers of material in fixed vertical alignment. For example, a dual-gate transistor structure could be fabricated using a single mask to form two transistor gates in fixed vertical alignment. Additionally a patterned array of stacked functional materials, such as stacked alternating refractive index dielectrics, can be made with the use of a color mask. The color mask of the present invention may also be used in combination with other patterning techniques such as traditional photomasks, maskless lithography, or additive processes as dictated by the final device design.

An important aspect of the present invention is that the color mask may contain particularly useful patterning information for the system. This color mask can be generated by any method that produces an image containing the desired colors with sufficient precision and registration for the anticipated application.

The color absorber in the color mask may be deposited and patterned by many methods. One method to produce the color mask is to print the mask using an ink containing dyes or pigments with the appropriate spectral quality. Inks used in the printing could be of any common formulation, which would typically include the colorant material along with a vehicle or solvent, binders, and surfactants. Examples of such printing systems are inkjet printing, gravure printing, flexography, offset lithography, screen or stencil printing, and relief printing. Color thermographic printing may be used to produce the different color absorbing layers on the support. Thermochromic compounds, bleachable dyes, heat decomposable compounds, or chemical color formers may be used to form the different color absorbing layer patterns on the support. The color absorber may be applied to the support using a laser or thermal transfer process from a donor sheet. Alternately, the color absorbing patterns may be produced on the support by an ablative recording process.

Particularly useful color absorbers are those materials with maximum absorption in a selected portion of the visible band and maximum transmission in remaining portions. So-called block-type dyes and cutoff filter materials are ideal for use in the multicolor mask. A receiving layer for color absorbing materials may optionally be coated on the back side of the support before the color absorbing material is applied.

The color absorber in the color mask may be formed by a photolithographic method using, for example, dyed photo-curable coatings, such as pigmented or dyed photoresist.

It may be particularly convenient and cost effective to produce a reusable master image for subsequent duplication on the main substrate. In this embodiment, a master mask image is produced of very high accuracy and resolution. This may be accomplished with any of the above techniques. Preferably, this would be done with a photolithographic method that allows a very high quality master image to be produced. It may even be preferable to produce the master image upon a rigid transparent substrate. The color information in the master color image can be reproduced on the main substrate using a color duplicating or color copying process. For negative-working duplication processes, the master color image would be provided as a negative copy of the multicolor mask.

In a traditional photolithographic process for large area electronic device fabrication, excellent alignment must be achieved over very large areas. In the above method of master duplication, the master may be considerably smaller and thus easier to fabricate, but then duplicated on the final substrate in a replicating pattern so as to cover a larger area. In display manufacturing a mother glass will usually contain several individual displays or operational units. In a preferred embodiment the master contains one full unit and can be reproduced several times on the mother substrate. Since the master contains the information for a full unit the tolerances on positioning between master exposures is not critical.

Color image capture processes employing light sensitive materials may be used to reproduce the master color image. The light sensitive layers can be composed of any set of materials capable of capturing a light pattern and subsequently being treated or developed in a way to produce a color pattern. Examples of such image capture materials are color negative photographic imaging layers, color reversal photographic imaging layers, color photothermographic imaging layers, Cyclolor imaging layers, and diffusion transfer color photographic imaging layers such as color instant films, and color Pictrography film. A master color image may alternatively be reproduced on the main substrate using a color duplicating or copying process such as color electrophotography. For the purposes of this invention, only the adhered mask is required to have a color. The resulting color mask may be produced a process using white light or light outside of the visible region. Examples of this process would be forming the mask by a photographic process which is panchromatically sensitive but results upon development in a color mask image.

The color mask can be produced on a separate roll of material and then laminated to the substrate. Preferably the lamination is done with the image side of the mask opposite the substrate and that the mask image is as close as possible to the functional layers to be patterned. For embodiments with a portion of the mask on the back-side of the substrate, the lamination should be done such that the mask image is as close to the substrate as possible.

It may be particularly advantageous for optical considerations to coat the main support layer directly onto the color absorbing layer of the color mask. In this embodiment, the color absorbing layer could be patterned on a carrier support roll and then the main support layer could be cast directly onto the color absorbing layer.

Alternately, the color absorbing layer can be patterned on a separate (donor) roll of material and then all of the color absorbing layers can be transferred in a single step from the donor roll onto the main substrate.

The color mask may be separated from the electronically active layers by a barrier layer. Depending on the application, it may be preferable to place the color layer on the back of a thin support it may be bleached or removed at the end of the fabrication process, and will not create planarity and contamination problems for the active device layers. It is important to understand the resolution limit for a remotely exposed photoresist layer in order to be able to appropriately place the color pattern on the support, as well as choose the color for the color mask. Exposure through the color mask can be referred to as a proximity exposure as in traditional photolithography. In proximity mode, the mask does not contact the wafer, so there are resolution losses due to diffraction effects. A useful discussion of resolution in this so-called proximity printing mode can be found in "Photoreactive Polymers: The Science and Technology of Resists" by A. Reiser, Wiley-Interscience, John Wiley & Sons, 1989, pp. 234-246.

The diffraction effect in proximity printing limits the minimum feature gap on the mask as described by Equation (1):

$$W_{min} \approx \sqrt{k \lambda S} \quad k \approx 1 \qquad \text{Equation (1)}$$

where $W_{min}$ is the minimum feature gap on the mask, $\lambda$ is the exposure wavelength, and S is the separation between the mask and the wafer. Similarly, the minimum line/gap period is given by the relationship:

$$2b_{min} = 3\sqrt{\lambda\left(s + \frac{z}{2}\right)} \qquad \text{Equation (2)}$$

where $b_{min}$ is the minimum line gap period, $\lambda$ is the exposure wavelength, s is the separation between the mask and the wafer, and z is the resist thickness.

These models indicate that even for a 100 um typical for flexible supports, 6-8 μm features are resolvable, depending on the exposure wavelength. Again at the 100 μm distance, a line/gap periodicity in the range 9-12 μm should be resolvable, depending on the exposure wavelength. In the case of front-side masking, the barrier thickness is also highly tunable. Table A uses Equations (1) and (2) to predict the minimum feature size and periodicity as a function of the mask and resist separation. Examples using 365 nm or 650 nm exposing light are shown as representative of the two ends of the visible spectrum.

TABLE A

| | Exposing wavelength (nm) | Mask and resist layer separation | | |
| --- | --- | --- | --- | --- |
| | | 1 um separation | 10 um separation | 100 um separation |
| $W_{min}$ minimum resolvable gap (μm) | 365 | 0.6 | 2 | 6 |
| | 650 | 0.8 | 2.5 | 8 |
| $b_{min}$ minimum resolvable periodicity (μm) | 365 | 1.1 | 3 | 9 |
| | 650 | 1.5 | 4 | 12 |

Many polymers can be caused to vary their properties by exposure to light, and thus be useful as photopatternable layers. Many typical light sensitive polymers are only sensitive to UV and deep UV radiation. Preferably the photopatternable materials for this invention are rendered sensitive to visible light.

A variety of photopolymerization systems that are activated by visible radiation have been developed. A useful discussion of UV curable and visible light photopatternable materials can be found in "Photoreactive Polymers: The Science and Technology of Resists" by A. Reiser, Wiley-Interscience, John Wiley & Sons, 1989, pp. 102-129. U.S. Pat. No. 4,859,572 by Farid et al., incorporated here by reference, describes a photographic imaging system, which relies on using visible light to harden an organic component and produce an image pattern. This reference describes a variety of suitable visible light sensitive photoinitiators, monomers, and film formulation guidelines for use in the curable layers of this invention.

Sensitivity to visible light can be accomplished by the use of polymerizable compound along with a photopolymerization initiator. In a preferred embodiment of the invention, the photosensitive resist contains a polymerizable compound selected from among compounds having at least one, preferably two or more, ethylenically unsaturated bond at terminals. Such compounds are well known in the industry and they can be used in the present invention with no particular limitation. Such compounds have, for example, the chemical form of a monomer, a prepolymer, i.e., a dimer, a trimer, and an oligomer or a mixture and a copolymer of them. As examples of monomers and copolymers thereof, unsaturated carboxylic acids (e.g., acrylic acid, methacrylic acid, itaconic acid; crotonic acid, isocrotonic acid, maleic acid, etc.), and esters and amides thereof can be exemplified, and preferably esters of unsaturated carboxylic acids and aliphatic polyhydric alcohol compounds, and amides of unsaturated carboxylic acids and aliphatic polyhydric amine compounds are used. In addition, the addition reaction products of unsaturated carboxylic esters and amides having a nucleophilic substituent such as a hydroxyl group, an amino group and a mercapto group with monofunctional or polyfunctional isocyanates and epoxies, and the dehydration condensation reaction products of these compounds with monofunctional or polyfunctional carboxylic acids are also preferably used. The addition reaction products of unsaturated carboxylic esters and amides having electrophilic substituents such as an isocyanato group and an epoxy group with monofunctional or polyfunctional alcohols, amines and thiols, and the substitution reaction products of unsaturated carboxylic esters and amides having releasable substituents such as a halogen group and a tosyloxy group with monofunctional or polyfunctional alcohols, amines and thiols are also preferably used. As another example, it is also possible to use compounds replaced with unsaturated phosphonic acid, styrene, vinyl ether, etc., in place of the above-unsaturated carboxylic acids.

Specific examples of ester monomers of aliphatic polyhydric alcohol compounds and unsaturated carboxylic acids include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, etc. As methacrylates, examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, and bis[p-(3-methacryloxy-2-hydroxy-propoxy)phenyl]dimethylmethane, bis[p-(methacryloxyethoxy)-phenyl]dimethylmethane. As itaconates, examples include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. As crotonates, examples include ethylene glycol dicrotonate, tetramethylene glycol dicrotonate, pentaerythritol dicrotonate, and sorbitol tetradicrotonate. As isocrotonates, examples include ethylene glycol diisocrotonate, pentaerythritol diisocrotonate, and sorbitol tetraisocrotonate. As maleates, examples include ethylene glycol dimaleate, triethylene glycol dimaleate, pentaerythritol dimaleate, and sorbitol tetramaleate. Further, the mixtures of the above-described ester monomers can also be used. Further, specific examples of amide monomers of aliphatic polyhydric amine compounds and unsaturated carboxylic acids include methylenebis acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, and xylylenebis-methacrylamide.

Further, urethane-based addition polymerizable compounds which are obtained by the addition reaction of an isocyanate and a hydroxyl group are also preferably used in the present invention. A specific example is a vinyl urethane compound having two or more polymerizable vinyl groups in one molecule, which is obtained by the addition of a vinyl monomer having a hydroxyl group represented by the following formula (V) to a polyisocyanate compound having two or more isocyanate groups in one molecule.

$CH_2$=$C(R)COOCH_2CH(R')OH$ wherein R and R' each represents H or $CH_3$.

Other examples include polyfunctional acrylates and methacrylates, such as polyester acrylates, and epoxy acrylates obtained by reacting epoxy resins with (meth)acrylic acids. Moreover, photo-curable monomers and oligomers listed in Sartomer Product Catalog by Sartomer Company Inc. (1999) can be used as well.

Depending upon the final design characteristics of the photosensitive material, a suitable addition polymerizable compound or combination of addition polymerizable compounds, having the desired structure and amounts can be used. For example, the conditions are selected from the following viewpoint. For the photosensitive speed, a structure containing many unsaturated groups per molecule is preferred and in many cases bifunctional or more functional groups are preferred. For increasing the strength of an image part, i.e., a cured film, trifunctional or more functional groups are preferred. It is effective to use different functional numbers and different polymerizable groups (e.g., acrylate, methacrylate, styrene compounds, vinyl ether compounds) in combination to control both photosensitivity and strength. Compounds having a large molecular weight or compounds having high hydrophobicity are excellent in photosensitive speed and film strength, but may not be preferred from the point of development speed and precipitation in a developing solution. The selection and usage of the addition polymerizable compound are important factors for compatibility with other components (e.g., a binder polymer, an initiator, a functional material, etc.) in the photopolymerization composition. For example, sometimes compatibility can be improved by using a low purity compound or two or more compounds in combination. Further, it is also possible to select a compound having specific structure for the purpose of improving the adhesion property of a support, a functional material, and an overcoat layer. Concerning the compounding ratio of the addition polymerizable compound in a photopolymerization composition, the higher the amount, the higher the sensitivity. But, too large an amount sometimes results in disadvantageous phase separation, problems in the manufacturing process due to the stickiness of the photopolymerization composition (e.g., manufacturing failure resulting from the transfer and adhesion of the photosensitive material components), and precipitation from a developing solution. The addition polymerizable compound may be used alone or in combination of two or more. In addition, appropriate structure, compounding ratio and addition amount of the addition polymerizable compound can be arbitrarily selected taking into consideration the degree of polymerization hindrance due to oxygen, resolving power, fogging characteristic, refractive index variation and surface adhesion. Further, the layer constitution and the coating method of undercoating and overcoating can be performed according to circumstances.

Organic polymeric binders which can form a part of the film forming component of the photopatternable layer include: (1) polyesters, including those based on terephthalic, isophthalic, sebacic, adipic, and hexahydroterephthalic acids; (2) nylons or polyamides; (3) cellulose ethers and esters; (4) polyaldehydes; (5) high molecular weight ethylene oxide polymers—e.g., poly(ethylene glycols), having average weight average molecular weights from 4000 to 4,000,000; (6) polyurethanes; (7) polycarbonates; (8) synthetic rubbers—e.g., homopolymers and copolymers of butadienes; and (9) homopolymers and copolymers formed from monomers containing ethylenic unsaturation such as polymerized forms of any of the various ethylenically unsaturated monomers, such as polyalkylenes—e.g. polyethylene and polypropylene; poly(vinyl alcohol); polystyrene; poly(acrylic and methacrylic acids and esters)—e.g. poly(methyl methacrylate) and poly(ethyl acrylate), as well as copolymer variants. The polymerizable compound and the polymeric binder can be employed together in widely varying proportions, including polymerizable compound ranging from 3 to 97 percent by weight of the film forming component and polymeric binder ranging from 97 to 3 percent by weight of the film forming component. A separate polymeric binder, although preferred, is not an essential part of the photopatternable film and is most commonly omitted when the polymerizable compound is itself a polymer.

Various photoinitiators can be selected for use in the above-described imaging systems. Preferred photoinitiators consist of an organic dye.

The amount of organic dye to be used is preferably in the range of from 0.1 to 5% by weight based on the total weight of the photopolymerization composition, preferably from 0.2 to 3% by weight.

The organic dyes for use as photoinitiators in the present invention may be suitably selected from conventionally known compounds having a maximum absorption wavelength falling within a range of 300 to 1000 nm. High sensitivity can be achieved by selecting a desired dye having an absorption spectrum that overlaps with the absorption spectrum of the corresponding color absorbing material of the multicolor mask described above and, optionally, adjusting the absorption spectrum to match the light source to be used. Also, it is possible to suitably select a light source such as blue, green, or red, or infrared LED (light emitting diode), solid state laser, OLED (organic light emitting diode) or laser, or the like for use in image-wise exposure to light.

Specific examples of the photoinitiator organic dyes include 3-ketocoumarin compounds, thiopyrylium salts, naphthothiazolemerocyanine compounds, merocyanine compounds, and merocyanine dyes containing thiobarbituric acid, hemioxanole dyes, and cyanine, hemicyanine, and merocyanine dyes having indolenine nuclei. Other examples of the organic dyes include the dyes described in Chemistry of Functional Dyes (1981, CMC Publishing Co., Ltd., pp. 393-416) and Coloring Materials (60[4], 212-224, 1987). Specific examples of these organic dyes include cationic methine dyes, cationic carbonium dyes, cationic quinoimine dyes, cationic indoline dyes, and cationic styryl dyes. Examples of the above-mentioned dyes include keto dyes such as coumarin dyes (including ketocoumarin and sulfonocoumarin), merostyryl dyes, oxonol dyes, and hemioxonol dyes; nonketo dyes such as nonketopolymethine dyes, triarylmethane dyes, xanthene dyes, anthracene dyes, rhodamine dyes, acridine dyes, aniline dyes, and azo dyes; nonketopolymethine dyes such as azomethine dyes, cyanine dyes, carbocyanine dyes, dicarbocyanine dyes, tricarbocyanine dyes, hemicyanine dyes, and styryl dyes; quinoneimine dyes such as azine dyes, oxazine dyes, thiazine dyes, quinoline dyes, and thiazole dyes.

Preferably, the photoinitiator organic dye is a cationic dye-borate anion complex formed from a cationic dye and an anionic organic borate. The cationic dye absorbs light having a maximum absorption wavelength falling within a range from 300 to 1000 nm and the anionic borate has four R groups, of which three R groups each represents an aryl group which may have a substitute, and one R group is an alkyl group, or a substituted alkyl group. Such cationic dye-borate anion complexes have been disclosed in U.S. Pat. Nos. 5,112,752; 5,100,755; 5,057,393; 4,865,942; 4,842,980; 4,800,149; 4,772,530; and 4,772,541, which are incorporated herein by reference.

When the cationic dye-borate anion complex is used as the organic dye in the photopolymerization compositions of the invention, it does not require to use the organoborate salt. However, to increase the photopolymerization sensitivity, it is preferred to use an organoborate salt in combination with the cationic dye-borate complex. The organic dye can be used singly or in combination.

Specific examples of the above-mentioned cationic dye-borate salts are given below. However, it should be noted that the present invention is not limited to these examples.

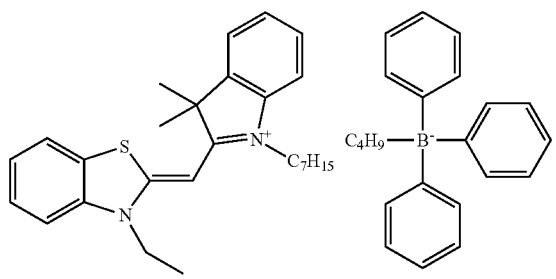

Dye-1

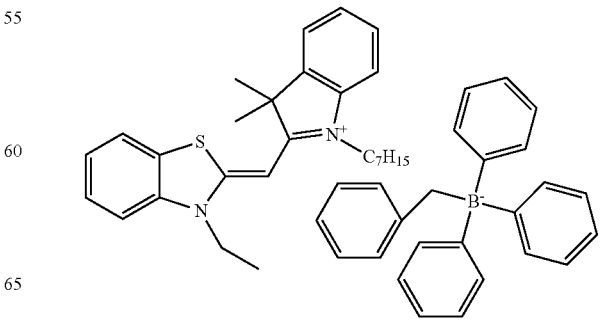

Dye-2

Dye-3
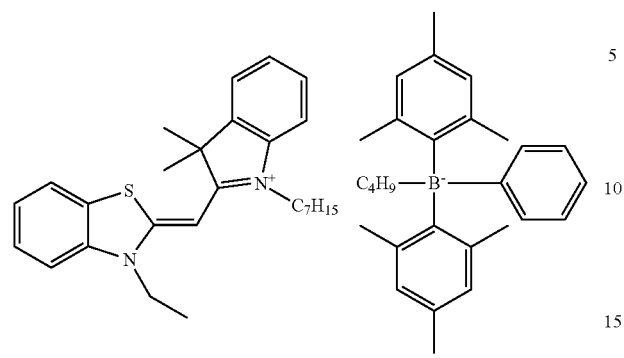
Dye-4
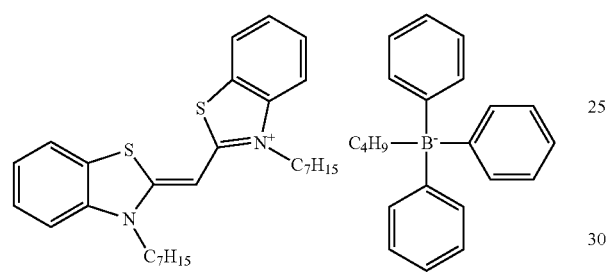
Dye-5
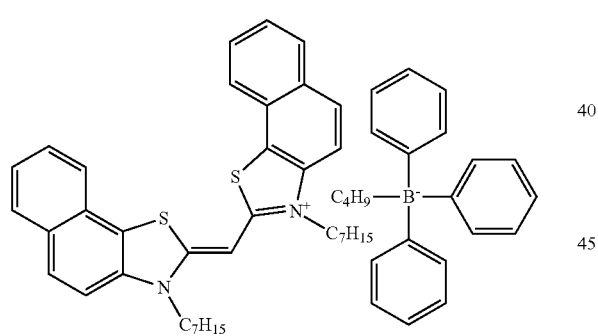
Dye-6
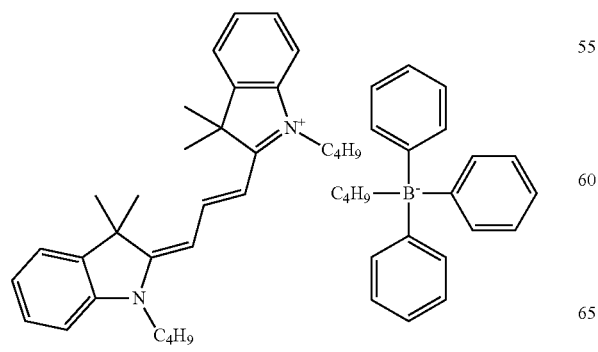
Dye-7
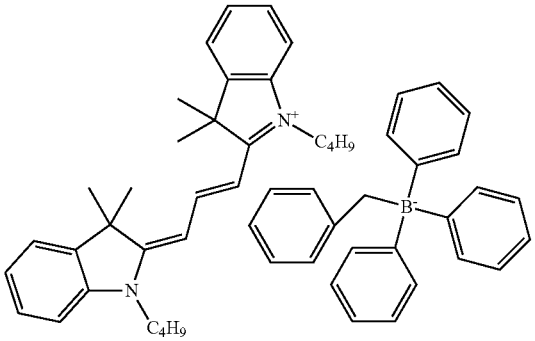
Dye-8
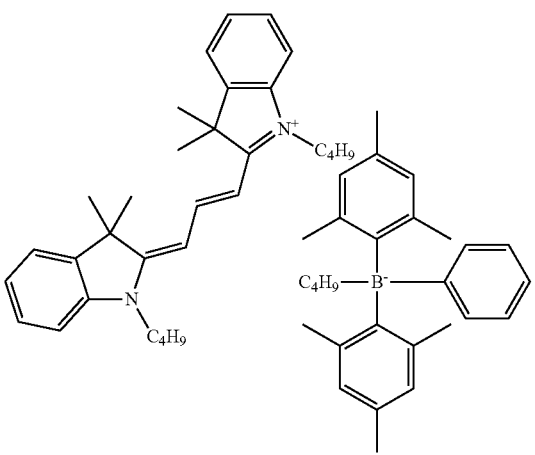
Dye-9
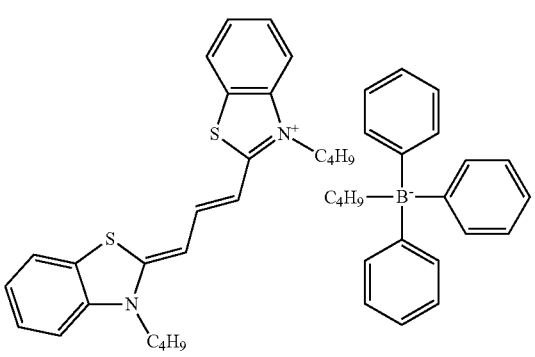
Dye-10
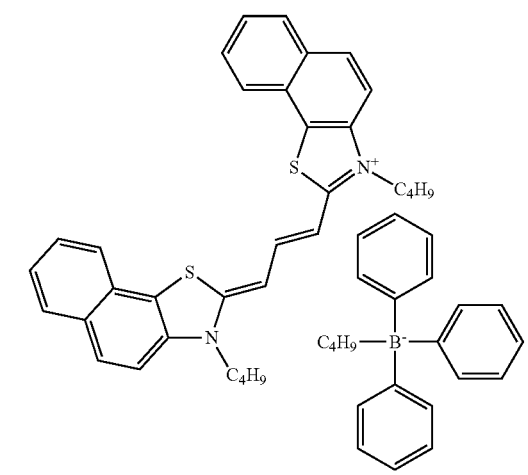

Dye-11
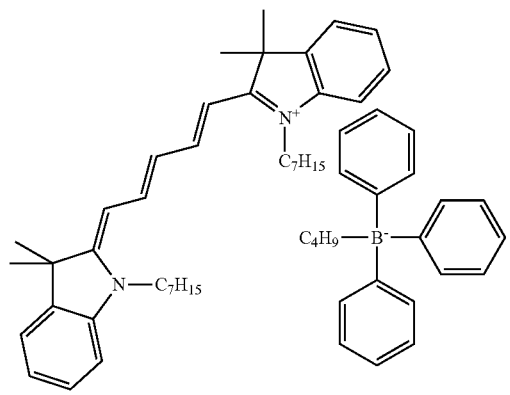
Dye-12
Dye-13
Dye-14
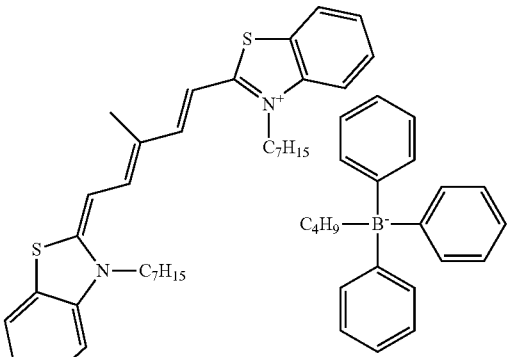
Dye-15
Dye-16
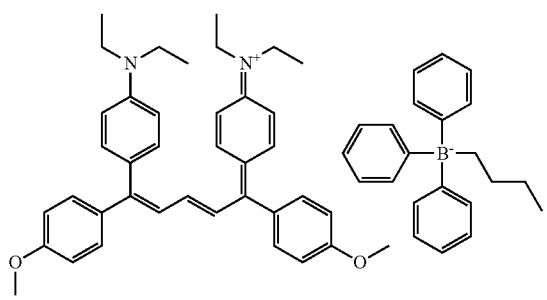
Dye-17
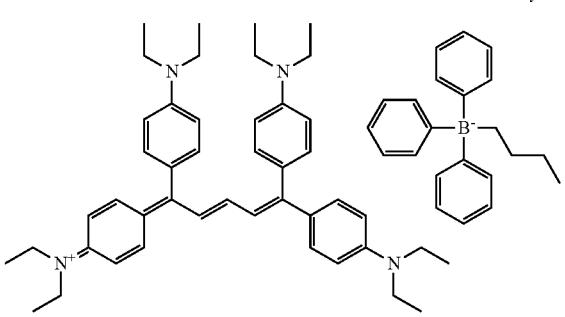

Dye-18

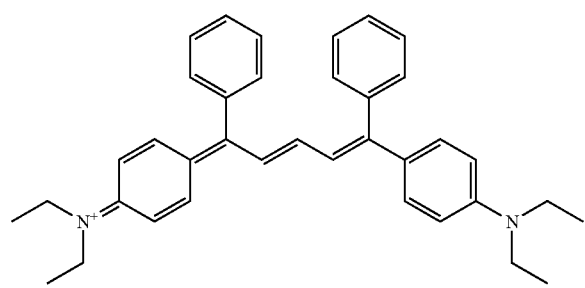

Dye-19

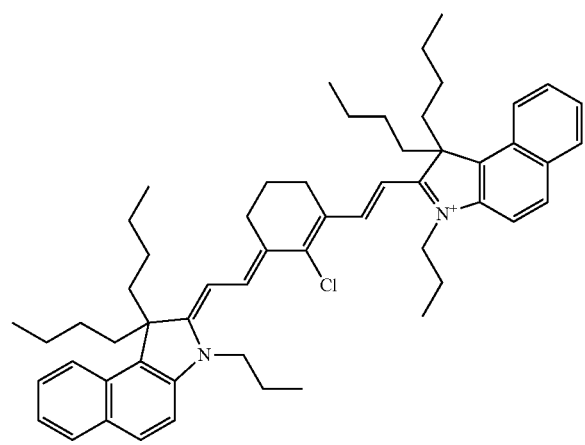

It may be preferable to use the photoinitiator in combination with an organic borate salt such as disclosed in U.S. Pat. Nos. 5,112,752; 5,100,755; 5,057,393; 4,865,942; 4,842,980; 4,800,149; 4,772,530; and 4,772,541. If used, the amount of borate compound contained in the photopolymerization composition of the invention is preferably from 0% to 20% by weight based on the total amount of photopolymerization composition. The borate salt useful for the photosensitive composition of the present invention is represented by the following general formula (I).

[BR$_4$]$^-$Z$^+$ where Z represents a group capable of forming cation and is not light sensitive, and [BR4]$^-$ is a borate compound having four R groups which are selected from an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkynyl group, an alicyclic group, a substituted alicyclic group, a heterocyclic group, a substituted heterocyclic group, and a derivative thereof. Plural Rs may be the same as or different from each other. In addition, two or more of these groups may join together directly or via a substituent and form a boron-containing heterocycle. Z+ does not absorb light and represents an alkali metal, quaternary ammonium, pyridinium, quinolinium, diazonium, morpholinium, tetrazolium, acridinium, phosphonium, sulfonium, oxosulfonium, iodonium, S, P, Cu, Ag, Hg, Pd, Fe, Co, Sn, Mo, Cr, Ni, As, or Se.

Specific examples of the above-mentioned borate salts are given below. However, it should be noted that the present invention is not limited to these examples.

BS-1

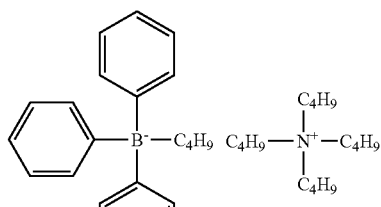

BS-2

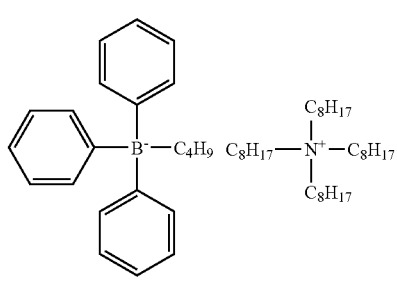

BS-3

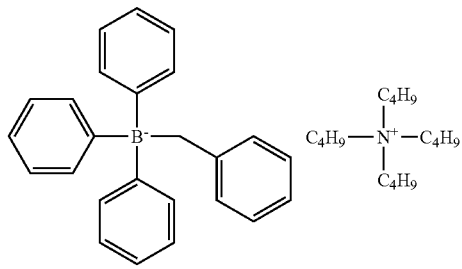

BS-4

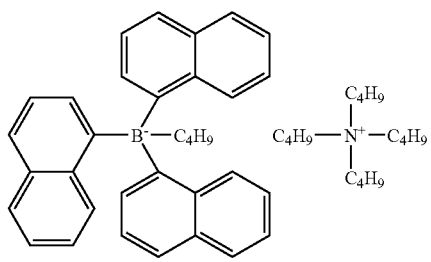

BS-5
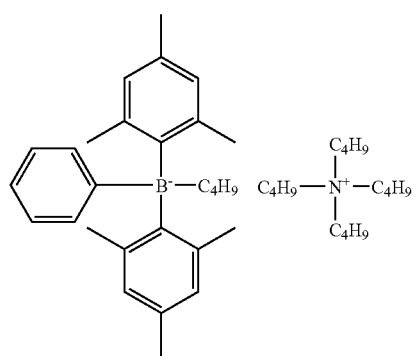
BS-6
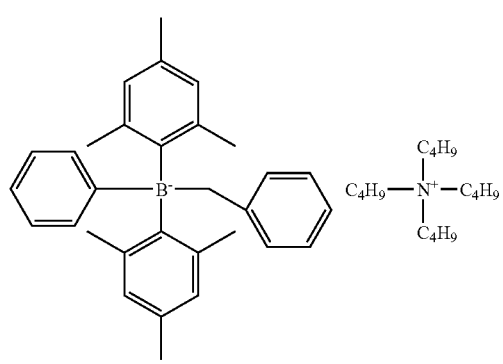
BS-7
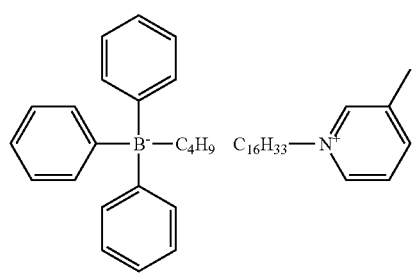
BS-8
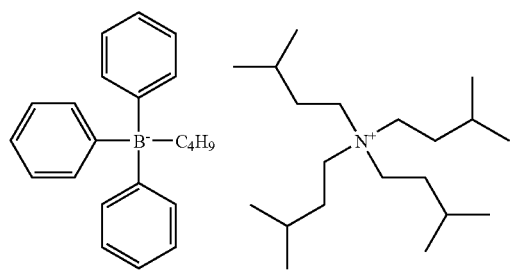
BS-9
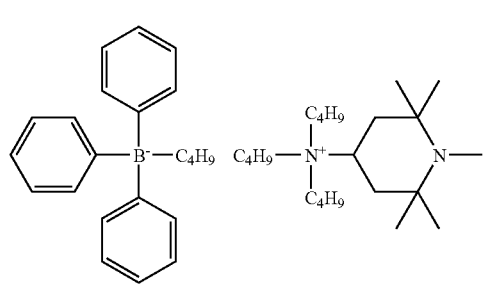
BS-10
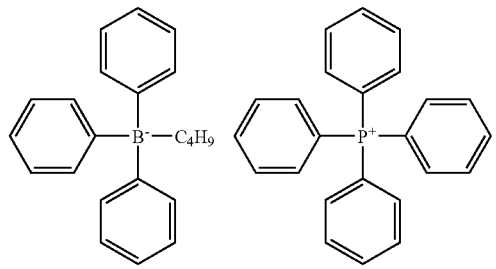
BS-11
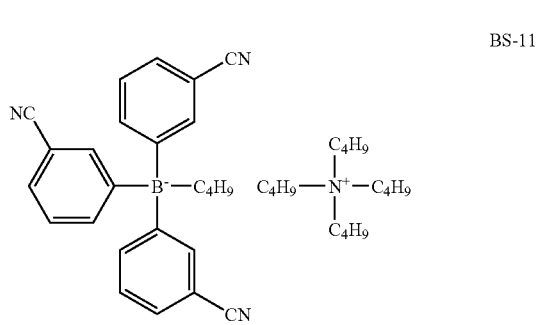
BS-12
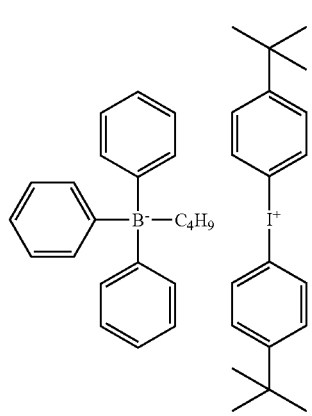
BS-13
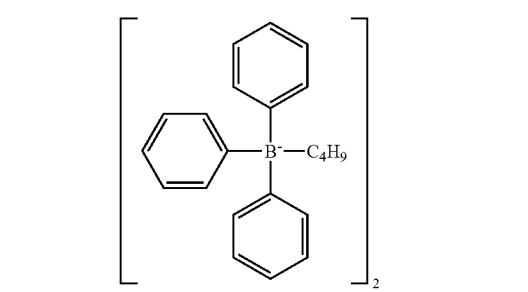
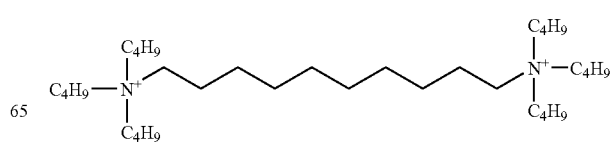

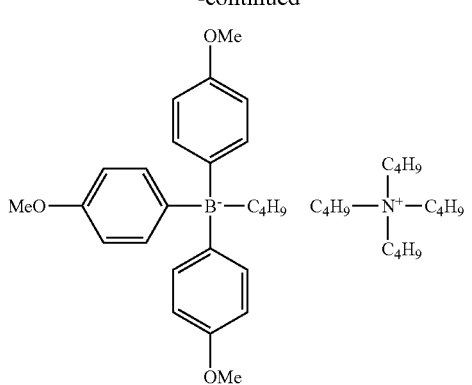

BS-14

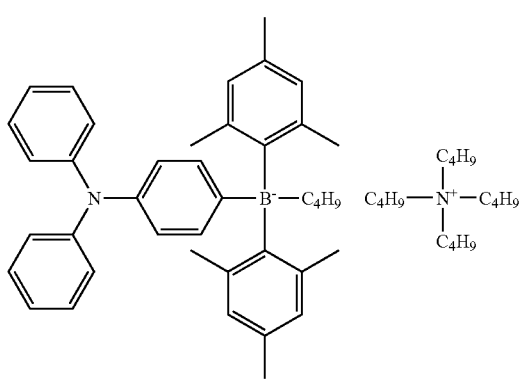

BS-15

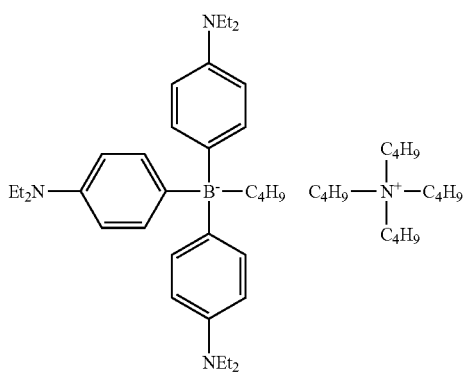

BS-16

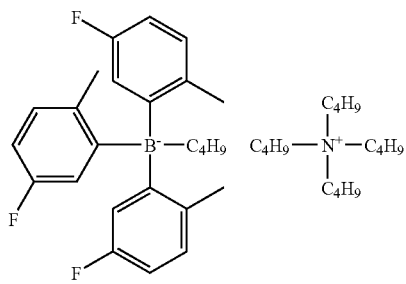

BS-17

Various additives can be used together with the photoinitiator system to affect the polymerization rate. For example, a reducing agent such as an oxygen scavenger or a chain-transfer aid of an active hydrogen donor, or other compound can be used to accelerate the polymerization. An oxygen scavenger is also known as an autoxidizer and is capable of consuming oxygen in a free radical chain process. Examples of useful autoxidizers are N,N-dialkylanilines. Examples of preferred N,N-dialkylanilines are dialkylanilines substituted in one or more of the ortho-, meta-, or para-position by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl, n-butoxy, n-pentyloxy, phenoxy, hydroxy, acetyl-oxy, methylthio, ethylthio, isopropylthio, thio- (mercapto-), acetylthio, fluoro, chloro, bromo and iodo. Representative examples of N,N-dialkylanilines useful in the present invention are 4-cyano-N,N-dimethylaniline, 4-acetyl-N,N-dimethylaniline, 4-bromo-N,N-dimethylaniline, ethyl 4-(N,N-dimethylamino)benzoate, 3-chloro-N,N-dimethylaniline, 4-chloro-N,N-dimethylaniline, 3-ethoxy-N,N-dimethylaniline, 4-fluoro-N,N-dimethylaniline, 4-methyl-N,N-dimethylaniline, 4-ethoxy-N,N-dimethylaniline, N,N-dimethylaniline, N,N-dimethylthioanicidine, 4-amino-N,N-dimethylaniline, 3-hydroxy-N,N-dimethylaniline, N,N,N',N'-tetramethyl-1,4-dianiline, 4-acetamido-N,N-dimethylaniline, 2,6-diisopropyl-N,N-dimethylaniline (DIDMA), 2,6-diethyl-N,N-dimethylaniline, N,N,2,4,6-pentamethylaniline (PMA) and p-t-butyl-N,N-dimethylaniline.

It may be preferable to use the photoinitiator in combination with a disulfide coinitiator. Examples of useful disulfides are described in U.S. Pat. No. 5,230,982 by Davis et al. which is incorporated herein by reference. Two of the most preferred disulfides are mercaptobenzothiazo-2-yl disulfide and 6-ethoxymercaptobenzothiazol-2-yl disulfide. In addition, thiols, thioketones, trihalomethyl compounds, lophine dimer compounds, iodonium salts, sulfonium salts, azinium salts, organic peroxides, and azides, are examples of compounds useful as polymerization accelerators.

Other additives which can be incorporated into the light curable coatings include polymeric binders, fillers, pigments, surfactants, adhesion modifiers, and the like. To facilitate coating on the support and functional layers the light curable film composition is usually dispersed in a solvent to create a solution or slurry, and then the liquid is evaporatively removed, usually with heating, after coating. Any solvent can be employed for this purpose which is inert toward the film forming components and addenda of the photopatternable film.

It may be preferable to practice the invention with positive-working photopatternable materials. By way of example, U.S. Pat. No. 4,708,925 by Newman (hereby incorporated by reference) describes a positive-working photopatternable composition containing novolak phenolic resins, an onium salt, and a dye sensitizer. In this system, there is an interaction between alkali-soluble phenolic resins and onium salts which results in an alkali solvent resistance when it is cast into a film. Photolytic decomposition of the onium salt restores solubility to the resin. Unlike the quinine diazides which can only be poorly sensitized, if at all, onium salts can be readily sensitized to a wide range of the electromagnetic spectrum from UV to infrared (280 to 1100 nm).

Examples of compounds which are known to sensitize onium salts are those in the following classes: diphenylmethane including substituted diphenylmethane, xanthene, acridine, methine and polymethine (including oxonol, cyanine, and merocyanine) dye, thiazole, thiazine, azine, aminoketone, porphyrin, colored aromatic polycyclic hydrocarbon, p-substituted aminostyryl compound, aminotriazyl methane, polyarylene, polyarylpolyene, 2,5-diphenylisobenzofuran, 2,5-diarylcyclopentadiene, diarylfuran, diarylthiofuran, diarylpyrrole, polyaryl-phenylene, coumarin and polyaryl-2-pyrazoline. The addition of a sensitizer to the system renders it sensitive to any radiation falling within the absorption spectrum of the said sensitizer. Other positive-working systems are known to those skilled in the art.

Once a photopatternable layer is exposed, it can be developed by any means known the art. Development is the process by which the soluble portions of the photopatternable layer are removed. Methods for developing typically include exposure to a selective solvent, heating, or combinations thereof. A liquid developer can be any convenient liquid which is capable of selectively removing the photopatternable layer based on exposure level. The exposed photopatternable layer can be sprayed, flushed, swabbed, soaked, sonicated, or otherwise treated to achieve selective removal. In its simplest form the liquid developer can be the same liquid employed as a solvent in coating the photopatternable film. In some instances the photoresist is not rendered soluble where it is ultimately to be removed, but is instead rendered susceptible to a particular reaction that occurs during exposure to a development solution which then permits solubility.

In patterning processes where the photopatterned film is not intended to be part of the final article, it needs to be removed after it has been used to successfully pattern an area. This removal can be accomplished with any means known in the art, included plasma treatments, especially plasmas including oxygen, solvent based stripping, and mechanical or adhesive means.

In many embodiments the photopatternable layer is simply a layer used to pattern another functional layer. However, circumstances may exist in which the light cured layer is also the functional layer. Examples of this are the use of a curable layer as a dielectric due to its insulating behavior, or as a structural element such as a small wall or microcell due to its mechanical properties, or as a passivation layer for protection of the underlying devices. This use of photopatternable layers as functional layers is not limited to the above examples.

In the process for the article of this invention there is required a light source that emits light of some spectrum, the color mask contain a color record in which each is capable of absorbing light of some spectrum, and a photopatternable layer that is capable of responding to light of some spectrum. The system can function in several modes:

(1) White light, defined as light of a very broad visible spectrum, can be used as the illumination source. In this case, it is required that the photopatternable layer have a sensitivity distribution that substantially matches the absorption spectrum of the color mask. Substantially matching spectrum is defined as the integrated product of the two spectra, each normalized to an area of 1, exceeding 0.5, preferably exceeding 0.75, most preferably exceeding 0.9.

(2) Colored light, as defined by light of a narrow spectrum, can be used as the illumination source. In this case, the absorption spectrum of photopatternable layer can be made to substantially match the spectrum of the emitted light, or the absorption spectrum can be broad.

In this process, light passes through the color mask and then through the previously applied functional layers on the front of the substrate. As a result, the light must pass through the previously applied layers with weak enough modulation as to not overly affect the resulting images formed on the applied light photopatternable layers. The requirement for transparency of the applied functional layers is thus limited to having an acceptably low effect on the photopatternable layer imaging process. In principle therefore, the previously applied materials can absorb light uniformly as long as this absorption is low, preferably having an optical density of less than 0.5. Furthermore, the materials can absorb very strongly but only in regions where the imaging chemistry is not being used, or where these spectral ranges have been used but in prior stages of the manufacture of the article. Furthermore, the final layer in the process can be of any opacity, since additional patterning is not required on top.

An aspect of this invention is the ability to at will use the color mask to form a pattern on the front side of the item by the direction light through the substrate to cause an effect. A number of methods can be used to cause the patterning.

(a) A functional material can be coated uniformly over the multicolor mask of the item and then overcoated with a photopatternable resist material that hardens when it is exposed to light through the substrate. The hardened material is then more difficult to remove, so in a subsequent development step, the photopatternable resist is patterned to have openings where no light has struck. The item can then be exposed to a material that attacks the functional layer, thus removing it where no light has struck. This is a negative etch process.

(b) A functional material can be coated uniformly upon over the multicolor mask of the item and then overcoated with a photopatternable resist material that softens when it is exposed to light from the back side. The softened materials is then easier to remove, so in a subsequent development step, the resist is patterned to have openings where light has struck. The item can then be exposed to a material that attacks the functional layer, thus removing it where light has struck. This is a positive etch process.

(c) A photopatternable resist material can be coated followed by exposure and development step as outlined in (a) or (b). This will yield a resist pattern that has holes in it. This can then be overcoated with a uniform layer of a functional material. If the entire item is then treated with a material that attacks the remaining photoresist under the functional material, it can remove material where photoresist resides. This will leave functional material where there was originally no photoresist. This is a lift-off process.

(d) A number of deposition processes employing both liquids and vapor phase chemical delivery can be tailored to operate in a manner where material selectively deposits only in certain areas. For example, a photopatternable resist material can be coated followed by exposure and development step as outlined in (a) or (b). Next, a deposition process that leads to material being deposited only in those regions where no resist material remains. The entire item is then treated with a material that attacks the remaining resist. This is selective deposition.

A support can be used for supporting the device during manufacturing, testing, and/or use. As used in this disclosure, the terms "support" and "substrate" may be used interchangeably. The skilled artisan will appreciate that a support selected for commercial embodiments may be different from one selected for testing or screening various embodiments. In some embodiments, the support does not provide any necessary electrical function for the device. This type of support is termed a "non-participating support" in this document. Useful materials can include organic or inorganic materials. For example, the support may comprise inorganic glasses, ceramic foils, polymeric materials, filled polymeric materials, acrylics, epoxies, polyamides, polycarbonates, polyimides, polyketones, poly(oxy-1,4-phenyleneoxy-1,4-phenylenecarbonyl-1,4-phenylene) (sometimes referred to as poly (ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP).

A flexible support is used in some embodiments. This allows for roll-to-roll or roll-to-sheet processing, which may be continuous, providing economy of scale and economy of manufacturing over flat and/or rigid supports. The flexible support chosen preferably is capable of wrapping around the circumference of a cylinder of less than about 50 cm diameter, more preferably 25 cm diameter, most preferably 10 cm diameter, without distorting or breaking, using low force as by unaided hands. The preferred flexible support may be rolled upon itself.

If flexibility is not a concern, then the substrate may be a wafer or sheet made of materials including glass as well as any other transparent material.

The thickness of the substrate may vary, and according to particular examples it can range from about 10 μm to about 1 mm. Preferably, the thickness of the substrate is in the range from about 10 μm to about 300 μM. Provided the exposing light source is sufficiently collimated to limit the angular spread of light through the support layer, even thicker substrates can be tolerated. Particularly for embodiments where a portion of the multicolor mask is on the back side of the support it may be advantageous, for optical considerations, to coat or cast the main support layer directly onto the color absorbing layers of the second portion of the multicolor mask. In some embodiments, the support is optional, particularly when support layer is a functional layer or a color absorbing layer of the multicolor mask.

In addition, the multicolor mask and support may be combined with a temporary support. In such an embodiment, a support may be detachably adhered or mechanically affixed to the multicolor mask.

Any material that can form a film on the substrate can be patterned with this invention, as long as the appropriate etching and or deposition conditions are chosen. General classes of functional materials that can be used include conductors, dielectrics or insulators, and semiconductors.

Functional materials of the present invention may be deposited in using any convenient method. Typical deposition processes include chemical vapor deposition, sputtering, evaporation, thermal transfer or solution processing. One embodiment of the current invention, the functional materials are applied using gravure or inkjet. In another embodiment the functional material is deposited using Atomic Layer Deposition (ALD). In a preferred embodiment of the present invention, the functional material is deposited by an ALD system consisting of a gas distribution manifold having a plurality of openings through which first and second reactive gases flow as the manifold and the substrate move relative to each other. Co-pending, commonly assigned US Patent Publication No. 2007/0238311, filed Mar. 29, 2006, describes such a method in detail and the disclosure of which is hereby incorporated in its entirety by reference.

Conductors can be any useful conductive material. A variety of conductor materials known in the art, are also suitable, including metals, degenerately doped semiconductors, conducting polymers, and printable materials such as carbon ink, silver-epoxy, or sinterable metal nanoparticle suspensions. For example, the conductor may comprise doped silicon, or a metal, such as aluminum, chromium, gold, silver, nickel, copper, tungsten, palladium, platinum, tantalum, and titanium. Conductors can also include transparent conductors such as indium-tin oxide (ITO), ZnO, $SnO_2$, or $In_2O_3$. Conductive polymers also can be used, for example polyaniline, poly(3,4-ethylenedioxythiophene)/poly(styrene sulfonate) (PEDOT:PSS). In addition, alloys, combinations, and multilayers of these materials may be most useful.

The thickness of the conductor may vary, and according to particular examples it can range from about 5 to about 1000 nm. The conductor may be introduced into the structure by chemical vapor deposition, sputtering, evaporation and/or doping, or solution processing.

A dielectric electrically insulates various portions of a patterned circuit. A dielectric layer may also be referred to as an insulator or insulating layer. The dielectric should have a suitable dielectric constant that can vary widely depending on the particular device and circumstance of use. For example, a dielectric constant from about 2 to 100 or even higher is known for a gate dielectric. Useful materials for a dielectric may comprise, for example, an inorganic electrically insulating material. Specific examples of materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of these examples can be used as a dielectric. Of these materials, aluminum oxides, silicon oxides, and silicon nitride are useful. The dielectric may comprise a polymeric material, such as polyvinylidenedifluoride (PVDF), cyanocelluloses, polyimides, polyvinyl alcohol, poly(4-vinylphenol), polystyrene and substituted derivatives thereof, poly (vinyl naphthalene) and substituted derivatives, and poly (methyl methacrylate) and other insulators having a suitable dielectric constant. The gate electric may comprise a plurality of layers of different materials having different dielectric constants.

The thickness of a dielectric layer may vary, and according to particular examples it can range from about 15 to about 1000 nm. The dielectric layer may be introduced into the structure by techniques such as chemical vapor deposition, sputtering, atomic layer deposition, evaporation, or a solution process.

Semiconductors used in this system may be organic or inorganic. Inorganic semiconductors include classes of materials exhibiting covalently bonded lattices, and may also include amorphous materials where the lattice exhibits only short range order. Examples of useful semiconducting materials are single elements such as silicon or germanium, and compound semiconductors such as gallium arsenide, gallium nitride, cadmium sulfide, and zinc oxide. Useful organic semiconductors include linear acenes such as pentacenes, naphthalenediimides such as those described in co-pending patent applications, perylenediimides, polythiophenes, polyfluorenes.

In typical applications of a thin film transistor, the desire is for a switch that can control the flow of current through the device. As such, it is desired that when the switch is turned on a high current can flow through the device. The extent of current flow is related to the semiconductor charge carrier mobility. When the device is turned off, it is desired that the current flow be very small. This is related to the charge carrier concentration. Furthermore, it is desired that the device be weakly or not at all influenced by visible light. In order for this to be true, the semiconductor band gap must be sufficiently large (>3 eV) so that exposure to visible light does not cause an inter-band transition. A material that is capable of yielding a high mobility, low carrier concentration, and high band gap is ZnO.

The entire process of making the thin film transistor or electronic device of the present invention, or at least the production of the thin film semiconductor, is preferably carried out below a maximum support temperature of about 200° C., more preferably below 150° C., most preferably below about 140° C., and even more preferably below about 100° C., or even at temperatures around room temperature (about 25° C. to 70° C.). The temperature selection generally depends on the support and processing parameters known in the art, once one is armed with the knowledge of the present invention contained herein. These temperatures are well below traditional integrated circuit and semiconductor processing temperatures, which enables the use of any of a variety of relatively inexpensive supports, such as flexible polymeric supports and the multicolor mask. Thus, the invention enables production of relatively inexpensive circuits containing thin film transistors.

Electronically or optically active layers may be formed and doped using solution processes, vacuum vapor deposition techniques, or atmospheric vapor deposition processes such as those described in co-pending Patent Publication Nos. 2007/0228470 and 2007/0238311, both filed Mar. 29, 2006.

Another aspect of the present invention is directed to an article comprising a transparent support, a color mask having a colored pattern on the transparent support, and a patterned layer of functional material on the same side of the transparent support as the color pattern, wherein the patterned layer of functional material is in register with the colored pattern on the transparent support. In one embodiment, only one patterned layer of functional material is in register with a color pattern on the transparent support. Various useful color patterns has been described above. For example, the color pattern can be made of a material that is capable of effectively transmitting white light but not visible light of the color of the color pattern.

The patterning methods of this invention are preferably used to create electrically and optically active components that are integrated on a substrate of choice. Circuit components can comprise transistors, resistors, capacitors, conductors, inductors, diodes, and any other electronics components that can be constructed by selecting the appropriate patterning and materials. Optically functional components can comprise waveguides, lenses, splitters, diffusers, brightness enhancing films, and other optical circuitry. Structural components can comprise wells, selective patterns of fillers and sealants, patterned barrier layers, walls and spacers.

Electronic devices in which TFTs and other devices are useful include, for example, more complex circuits, e.g., shift registers, integrated circuits, logic circuits, smart cards, memory devices, radio-frequency identification tags, backplanes for active matrix displays, active-matrix displays (e.g. liquid crystal or OLED), solar cells, ring oscillators, and complementary circuits, such as inverter circuits, for example, in which a combination of n-type and p-type transistors are used. In an active matrix displays, a transistor made according to the present invention can be used as part of voltage hold circuitry of a pixel of the display. In such devices, the TFTs are operatively connected by means known in the art.

One example of a microelectronic device is an active-matrix liquid-crystal display (AMLCD). One such device is an optoelectronic display that includes elements having electrodes and an electro-optical material disposed between the electrodes. A connection electrode of the transparent transistor may be connected to an electrode of the display element, while the switching element and the display element overlap one another at least partly. An optoelectronic display element is here understood to be a display element whose optical properties change under the influence of an electrical quantity such as current or voltage such as, for example, an element usually referred to as liquid crystal display (LCD). The presently detailed transistor has sufficient current carrying capacity for switching the display element at such a high frequency that the use of the transistor as a switching element in a liquid crystal display is possible. The display element acts in electrical terms as a capacitor that is charged or discharged by the accompanying transistor. The optoelectronic display device may include many display elements each with its own transistor, for example, arranged in a matrix. Certain active matrix pixel designs, especially those supplying a display effect that is current driven, may require several transistors and other electrical components in the pixel circuit.

EXAMPLES

The following non-limiting examples further describe the practice of the instant invention.

A. Visible Light Curable Film Components

The following materials and coating solutions were used to prepare the visible light patternable films.

Stock solution CF-1 contained two grams of polymethylmethacrylate (PMMA) (MW ~75K), 6.5 g of trimethylolpropane triacrylate, and 20 g of anisole. Stock solution CF-2 was a commercial product CT2000L supplied by Fuji Photochemicals containing a methacrylate derivative copolymer and polyfunctional acrylate resin in a mixture of 2-propanol-1-methoxyacetate and 1-ethoxy-2-propanol acetate. Stock solution CF-3 contained 1.25 g of a Novolak resin, and 0.2 g of Irgacure 250 (purchased from CIBA Specialty Chemicals), in MEK. Stock solution CF-4 was a positive-working commercial resist SC-1827, (purchased from Rohm and Haas Electronic Materials). Stock solutions CF1-CF3 were sensitized to visible light by addition of a dye photoinitiator. Photoinitiator structures appear in Table 1. Photoinitiator solutions were prepared as follows. YPI-1 was a 1% solution of yellow photoinitiator A in anisole. YPI-2 was a 1% solution of yellow photoinitiator A in cyclohexanone. MPI-1 was a 1% solution of magenta photoinitiator B in anisole. MPI-2 was a 1% solution of magenta photoinitiator in cyclohexanone. CPI-1 was a 1% solution of cyan photoinitiator C in anisole. CPI-2 was a 1% solution of photoinitiator C in cyclohexanone. Developer D-1 was MIBK. Developer D-2 was an aqueous solution containing 0.002 M tetramethylammonium hydroxide and 0.002 M diethanolamine. Developer D-3 was Microposit™ MF™-319, purchased from Rohm and Haas Electronic Materials. Developer solution D-4 was Kodak Goldstar Plus Positive Plate Developer.

TABLE 1

| | Dye | λmax |
|---|---|---|
| Photoinitiator A | (structure) | 450 nm |

TABLE 1-continued

| | Dye | λmax |
|---|---|---|
| Photoinitiator B | [structure] | 555 nm |
| Photoinitiator C | [structure] | 645 nm |

B. Electrical Characterization of Transistor Structures

Electrical characterization of the fabricated devices was performed with a Hewlett Packard HP 4156® parameter analyzer. Device testing was done in air in a dark enclosure.

The results were averaged from several devices. For each device, the drain current (Id) was measured as a function of source-drain voltage (Vd) for various values of gate voltage (Vg). Furthermore, for each device the drain current was measured as a function of gate voltage for various values of source-drain voltage. Vg was swept from minus 10 V to 40 V for each of the drain voltages measured, typically 5 V, 20 V, and 35 V, and 50 V. Mobility measurements were taken from the 35V sweep.

Parameters extracted from the data include field-effect mobility (μ), threshold voltage (Vth), subthreshold slope (S), and the ratio of Ion/Ioff for the measured drain current. The field-effect mobility was extracted in the saturation region, where Vd>Vg−Vth. In this region, the drain current is given by the equation (see Sze in *Semiconductor Devices—Physics and Technology*, John Wiley & Sons (1981)):

$$I_d = \frac{W}{2L}\mu C_{ox}(V_g - V_{th})^2$$

where, W and L are the channel width and length, respectively, and $C_{ox}$ is the capacitance of the oxide layer, which is a function of oxide thickness and dielectric constant of the material. Given this equation, the saturation field-effect mobility was extracted from a straight-line fit to the linear portion of the $\sqrt{I_d}$ versus Vg curve. The threshold voltage, $V_{th}$, is the x-intercept of this straight-line fit.

Example 1

Blue-sensitive coating C-1, green-sensitive coating C-2, and red-sensitive coating C-3, were formulated to produce photopatterns using a color mask as follows. Photosensitive coatings were prepared from a solution that contained 3.9 g of CF-1 and 0.5 g of the photoinitiator solution indicated in Table 2. Red absorbing (cyan), green absorbing (magenta), and blue absorbing (yellow) color masks were prepared using a Kodak Professional 8670 Thermal Printer. The photosensitive coatings were prepared by spin coating at 1000 RPM for one minute and were dried for one minute at 80 C and loaded in a glass cell purged with nitrogen. The peak wavelength of the resulting photosensitive coatings, λmax, is shown in Table 2. The coatings were illuminated with colored light in such fashion that exposing light passed through the glass support and color mask before reaching the photosensitive coating. Unexposed portions of the photosensitive coating were removed by developing for 1 minute in D-1. These steps resulted in formation of a negative patterned polymer film corresponding to the color pattern on the color mask. Results are summarized in Table 2 below.

TABLE 2

| Example | Stock Solution | Photoinitiator | λmax | Color Mask | Photopattern obtained |
|---|---|---|---|---|---|
| C-1 | CF-1 | YPI-1 | 450 nm | Blue | Negative |
| C-2 | CF-1 | MPI-1 | 557 nm | Green | Negative |
| C-3 | CF-1 | CPI-1 | 656 nm | Red | Negative |

Example 2

Blue-sensitive coating C-4, green-sensitive coating C-5, and red-sensitive coating C-6, were formulated to produce photopatterns using a color mask as follows. Photosensitive coatings were prepared from a solution that contained 4 g of CF-2 and 0.5 g of the photoinitiator solution indicated in Table 2. The coatings were illuminated with colored light in such fashion that exposing light passed through the glass support and color mask before reaching the photosensitive coating. Unexposed portions of the photosensitive coating were removed by developing for 1 minute in D-2. These steps resulted in formation of a negative patterned polymer film corresponding to the color pattern on the color mask. Results are summarized in Table 3 below.

TABLE 3

| Example | Stock Solution | Photoinitiator | Exposing light | Photopattern obtained |
|---|---|---|---|---|
| C-4 | CF-2 | YPI-2 | Blue | negative |
| C-5 | CF-2 | MPI-2 | Green | negative |
| C-6 | CF-2 | CPI-2 | Red | negative |

Examples 3

Blue-sensitive coating C-7, green-sensitive coating C-8, and blue-sensitive coating C-9, were formulated to produce photopatterns using a color mask as follows. These photosensitive coatings are positive-working.

Coating solution CF7 contained 5 g of CF-3 and 2 g of the YPI-2. Coating solution CF8 contained 5 g of CF-3 and 2 g of MPI-2. These coating solutions were spin coated at 2000 RPM for one minute and dried for 1 minute at 80 C. These coatings were exposed in air and developed in the same manner as for examples C4-C6, and the coatings were developed for 20 seconds using developer solution D-4. These steps resulted in formation of a positive patterned polymer film corresponding to a specific a color pattern on the multicolor mask. Results are summarized in Table 4 below. Example C-7 is a positive-working, blue sensitive film. Example C-8 is a positive-working, green sensitive film. Similarly, coating C-9 was prepared and exposed with blue light, developed using D-3, forming a positive resist image.

TABLE 4

| Example | Stock Solution | Photoinitiator | Exposing light | Photopattern obtained |
|---|---|---|---|---|
| C-7 | CF-3 | YPI-2 | Blue | Positive |
| C-8 | CF-3 | MPI-2 | Green | positive |
| C-9 | CF-4 | As purchased | Blue | positive |

Example 4

Thin Film Transistor

A transistor was prepared using a back side color mask to simplify alignment steps for transparent TFT gate, dielectric, and semiconductor components. A green color absorbing layer GCA-1 was applied to a clean glass support by the following method. The sample was spin coated (at 1000 RPM) with magenta photoresist SM3000L, obtained from Fujifilm Electronic Materials Col, Ltd., baked for 1 minute at 95 C, and exposed using a laser-written molybdenum mask. The coating was developed, and baked for 5 minutes at 200 C forming green color absorbing layer GCA-1. The green color absorbing pattern GCA-1 was a negative of the desired semiconductor pattern.

Using the color absorbing pattern GCA-1 to simplify the mask alignment step, the ITO gate layer was deposited of the front side of the substrate and patterned using an etch process. Then, ALD coatings of alumina and zinc oxide were applied using an atmospheric deposition process. The semiconductor layer was patterned using a negative etch process and green-sensitive photopatternable material.

A coating solution was prepared containing 4 g of CT2000L (obtained from Fuji Photochemicals) and 0.5 g of a 1% solution of Photoinitiator B dissolved in cyclohexanone. The coating solution was spin coated at 2000 RPM for one minute and dried for 2 minutes at 90 C. A 10% PVA coating was applied at 1000 RPM for 2 minutes and dried at 90 C for 2 minutes. The coating was exposed using green light in such fashion that exposing light passed through the glass support and color mask layer GCA-1 before reaching the photosensitive coating, and the photosensitive coating was developed in an aqueous solution containing 0.002 M tetramethylammonium hydroxide and 0.002 M diethanolamine.

Using the color absorbing pattern GCA-1 to simplify the mask alignment step of the source and drain with the transparent gate, dielectric, and semiconductor layers, the source and drain contacts were prepared using a liftoff process. The resulting transistors had mobility 8.8 $cm^2/V$-s.

The fabrication sequence employing a color mask as outlined above allows for accurate placement of a transparent functional layer on the substrate even while exposing the substrate to varying temperature and solvent treatments. Further, even for large area substrates, there are no issues with dimensional distortion of the substrate or mechanical alignment errors leading to cumulative and catastrophic alignment errors. Use of the color mask and visible light curable films provides a unique solution to the registration challenge without the need for expensive alignment equipment and processes.

The invention claimed is:
1. A process for forming a structure comprising:
   a) providing a transparent support having a front side and a back side;
   b) forming a color mask, having a color pattern, on one side of the transparent support, either the front side or the back side;
   c) coating a layer photopatternable material sensitive to visible light on the front side of the transparent support after forming the color mask;
   d) exposing the layer of photopatternable material through the color mask with visible light to form a photopattern corresponding to the color pattern of the color mask wherein the photopattern is composed of photopatternable material changed to a second exposed state that is different from a first as-coated state;
   e) depositing a layer of functional material before or after coating the layer of photopatternable material; and
   f) patterning the layer of functional material using the photopattern such that the layer of functional material has a resulting patterned layer of functional material that corresponds to the color pattern of the color mask.
2. The process of claim 1 wherein no other color pattern of a different color, in any color mask formed on the transparent support, is present that is used to form another patterned layer of functional material.
3. The process of claim 1 wherein the colored mask is on the front side of the transparent support.
4. The process of claim 2 wherein the color mask, transparent support, and patterned layer of functional material remain in the structure.
5. A process for forming a structure comprising:
   a) providing a transparent support;
   b) forming a color mask having a color pattern on a first side of the transparent support;

c) coating a layer of functional photopatternable material sensitive to visible light on the first side of the transparent support after forming the color mask;

d) exposing the layer of functional photopatternable material through the color mask with visible light to form a photopattern corresponding to the color pattern of the color mask wherein the photopattern is composed of functional photopatternable material that has been changed to a second exposed state that is different from a first as-coated state, and e) patterning the layer of functional photopatternable material such that the layer has a resulting patterned layer of functional material that is formed by removal of an area of the layer of photopatternable functional material corresponding to the photopattern.

6. The process of claim 5 wherein no other color pattern of a different color, in any color mask formed on the transparent support, is present that is used to form another patterned layer of functional photopatternable material.

7. The process of claim 5 wherein the color mask, transparent support, and patterned functional material remain in the structure.

8. The process of claim 1 wherein an area of the layer of photopatternable material not exposed to the visible light is removed prior to step (e).

9. The process of claim 1 wherein the visible light utilized for exposing the layer of photopatternable material has a light spectrum matching the color of the color pattern of the colored mask.

10. The process of claim 1 wherein the visible light used for exposing the layer of photopatternable material is white light, and the photopatternable material is only curable by a light spectrum matching the color of the color pattern of the colored mask.

11. The process of claim 1 wherein the photopatternable material is changed to the second exposed state by visible light having a light spectrum matching the color of the color pattern of the color mask, and the visible light utilized for exposing the layer of photopatternable material also has the same color.

12. The process of claim 1 wherein said color mask comprises a layer formed by photographic replication of a master color image onto said transparent support.

13. The process of claim 1 wherein said color mask is laminated onto said transparent support after being preformed on a substrate separate from the transparent support.

14. The process of claim 1 wherein said colored mask is directly printed onto said transparent support.

15. The process of claim 1 wherein said transparent support comprises glass or flexible polymer.

16. The process of claim 1 wherein the photopatternable material that changes to the second exposed state by said visible light comprises a material sensitive to a single color.

17. The process of claim 1 wherein the photopatternable layer contains an initiator system, for ethylenic addition polymerization, that comprises a dye photoinitiator capable of absorbing imaging radiation to achieve an excited state only within a specific color wavelength range.

18. The process of claim 1 further comprising the step of coating at least one more additional layer of functional material onto the previously said patterned layer of functional material and patterning said additional layer of functional material in register with the previously said patterned layer of functional material.

19. A process for forming a structure comprising:
a) providing a transparent support having a front side and a back side;
b) forming a color mask, having a color pattern, on one side of the transparent support, either the front side or the back side;
c) coating a layer photopatternable material sensitive to visible light on the front side of the transparent support after forming the color mask;
d) exposing the layer of photopatternable material through the color mask with visible light to form a photopattern corresponding to the color pattern of the color mask wherein the photopattern is composed of photopatternable material changed to a second exposed state that is different from a first as-coated state; and
e) patterning a layer of functional material using the photopattern such that the layer of functional material has a resulting pattern that corresponds to the color pattern of the color mask, wherein the layer of functional material may be the layer of photopatternable material or a layer separate from the layer of photopatternable material, wherein the resulting pattern is formed by removal of an area of the layer of functional material or by selective area deposition of the layer of functional material.

* * * * *